(12) United States Patent
Inazu et al.

(10) Patent No.: US 9,112,115 B2
(45) Date of Patent: Aug. 18, 2015

(54) NITRIDE SEMICONDUCTOR ULTRAVIOLET LIGHT-EMITTING ELEMENT

(75) Inventors: Tetsuhiko Inazu, Aichi (JP); Cyril Pernot, Aichi (JP); Akira Hirano, Aichi (JP)

(73) Assignee: SOKO KAGAKU CO., LTD., Aichi (JP)

( * ) Notice: Subject to any disclaimer, the term of this patent is extended or adjusted under 35 U.S.C. 154(b) by 63 days.

(21) Appl. No.: 14/009,954

(22) PCT Filed: Apr. 21, 2011

(86) PCT No.: PCT/JP2011/059829
§ 371 (c)(1),
(2), (4) Date: Oct. 4, 2013

(87) PCT Pub. No.: WO2012/144046
PCT Pub. Date: Oct. 26, 2012

(65) Prior Publication Data
US 2014/0021442 A1    Jan. 23, 2014

(51) Int. Cl.
*H01L 29/06*    (2006.01)
*H01L 33/40*    (2010.01)
*H01L 33/32*    (2010.01)

(52) U.S. Cl.
CPC ............... *H01L 33/405* (2013.01); *H01L 33/32* (2013.01)

(58) Field of Classification Search
CPC ...................................... H01L 33/405
USPC .......................................... 257/13
See application file for complete search history.

(56) References Cited

U.S. PATENT DOCUMENTS

2005/0156185 A1    7/2005  Kim et al.
2006/0289886 A1    12/2006 Sakai
(Continued)

FOREIGN PATENT DOCUMENTS

JP    2004281863 A    10/2004
JP    2005116794 A    4/2005
(Continued)

OTHER PUBLICATIONS

Kentaro Nagamatsu, et al., "High-efficiency AlGaN-based UV light-emitting diode on laterally overgrown AlN," Journal of Crystal Growth, 2008, 310, pp. 2326-2329.

(Continued)

*Primary Examiner* — Ajay K Arora
(74) *Attorney, Agent, or Firm* — Haynes Beffel & Wolfeld LLP; James F. Hann

(57) ABSTRACT

An active layer including an AlGaN semiconductor layer having a band gap energy of 3.4 eV or higher and a p-type cladding layer configured of a p-type AlGaN semiconductor layer and located above the active layer are formed in a first region on the n-type cladding layer, the first region being in a plane parallel to a surface of the n-cladding layer configured of an n-type AlGaN semiconductor layer. An n-electrode metal layer making Ohmic contact with the n-type cladding layer is formed on an adjacent region to the first region in a second region which is a region other than the first region on the n-type cladding layer. A first reflective metal layer reflecting ultraviolet light emitted from the active layer is formed on a surface of the n-type cladding layer in the second region other than the adjacent region. The n-electrode metal layer is arranged between the first region and a region in which the first reflective metal layer contacts the surface of the n-type cladding layer.

17 Claims, 28 Drawing Sheets

(56) References Cited

U.S. PATENT DOCUMENTS

| | | |
|---|---|---|
| 2008/0123711 A1 | 5/2008 | Chua et al. |
| 2008/0144688 A1 | 6/2008 | Chua et al. |
| 2009/0057707 A1 | 3/2009 | Katsuno et al. |
| 2009/0090932 A1 | 4/2009 | Bour et al. |
| 2010/0200881 A1* | 8/2010 | Masaki .................. 257/98 |
| 2011/0254048 A1 | 10/2011 | Amano et al. |
| 2013/0328013 A1* | 12/2013 | Inazu et al. .................. 257/13 |

FOREIGN PATENT DOCUMENTS

| | | |
|---|---|---|
| JP | 2006339384 A | 12/2006 |
| JP | 2008171941 A | 7/2008 |
| WO | 2009020235 A1 | 2/2009 |

OTHER PUBLICATIONS

Shigeaki Sumiya, et al., "AlgaN-Based Deep Ultraviolet Light-Emitting Diodes Grown on Epitaxial AlN/Sapphire Templates," Japanese Journal of Applied Physics, vol. 47, No. 1, 2008, pp. 43-46.

N. Lobo, et al., "Enhancement of light extraction in ultraviolet light-emitting diodes using nanopixel contact design with Al reflector," Applied Physics Letters, 96, 081109, 2010, 4 p.

International Search Report from PCT/JP2011/059829; mailed Jul. 19, 2011; 4 p.

* cited by examiner

|  | Light Emission Output P [mW] | Forward Voltage Vf [V] | Conversion Efficiency E |
| --- | --- | --- | --- |
| Example 1 | 3.24 (115%) | 5.16 (104%) | 3.14 |
| Comparative Example 1 | 2.82 | 4.97 | 2.83 |
| Example 2 | 3.24 (117%) | 4.63 (98%) | 1.17 |
| Comparative Example 2 | 2.78 | 4.74 | 0.98 |

FIG. 16

|  | Light Emission Output P [mW] | Forward Voltage Vf [V] | Conversion Efficiency E |
| --- | --- | --- | --- |
| Example 3A | 7.55 (129%) | 7.41 (119%) | 1.70 |
| Example 3B | 7.61 (130%) | 7.90 (127%) | 1.61 |
| Example 3C | 7.70 (132%) | 7.81 (125%) | 1.64 |
| Comparative Example 3 | 5.85 | 6.23 | 1.57 |

FIG. 25

NITRIDE SEMICONDUCTOR ULTRAVIOLET LIGHT-EMITTING ELEMENT

CROSS-REFERENCE TO RELATED APPLICATIONS

This application is a National Phase filing under 35 U.S.C. §371 of International Application No. PCT/JP2011/059829 filed on Apr. 21, 2011.

TECHNICAL FIELD

The present invention relates to a nitride semiconductor ultraviolet light-emitting element used for a light-emitting diode, a laser diode, and the like, and having a center emission wavelength of about 355 nm or smaller, and relates, in particular, to a technique for improving external quantum efficiency.

BACKGROUND ART

Conventionally, as a GaN nitride semiconductor, a light-emitting element and a light-receiving element having a multilayer structure based on a GaN layer or an AlGaN layer having a relatively small AlN molar fraction (also referred to as AlN mixed crystal ratio or Al composition ratio) are produced (see, for example, Non-Patent Documents 1 and 2). FIG. 28 illustrates a typical crystal layer structure of a GaN light-emitting diode. The light-emitting diode illustrated in FIG. 28 has a laminated structure in which, after an underlying layer 102 of AlN is formed on a sapphire substrate 101, and then a periodic groove pattern is formed thereon by photolithography and reactive ion etching, an ELO (Epitaxial Lateral Overgrowth)-AlN layer 103 is formed as a template; and an n-type cladding layer 104 of n-type AlGaN having a thickness of 2 μm, an AlGaN/GaN multi-quantum well active layer 105, a p-type AlGaN electron block layer 106 having an Al composition ratio which is larger than that of the multi-quantum well active layer 105 and having a thickness of 20 nm, a p-type cladding layer 107 of p-type AlGaN having a thickness of 50 nm, and a p-type GaN contact layer 108 having a thickness of 20 nm are sequentially stacked on the ELO-AlN template 103. The multi-quantum well active layer 105 has a five-layered structure including a GaN well layer having a film thickness of 2 nm and sandwiched by AlGaN barrier layers having a film thickness of 8 nm. After crystal growth, in order to partially expose a surface of the n-type cladding layer 104, the multi-quantum well active layer 105, the electron block layer 106, the p-type cladding layer 107, and the p-type contact layer 108 thereon are etched off. A p-electrode 109 of Ni/Au is formed on a surface of the p-type contact layer 108, for example, and an n-electrode 110 of Ti/Al/Ti/Au is formed on the surface of the exposed n-type cladding layer 104, for example. By arranging a GaN well layer into an AlGaN well layer, and changing the AlN molar fraction or the thickness of the AlGaN well layer, the emission wavelength is made shorter, or by adding In, the emission wavelength is made longer, so that a light-emitting diode in an ultraviolet region having a wavelength of about 200 nm to 400 nm can be produced. A semiconductor laser can also be produced in a similar manner.

Light emitted from the active layer propagates in all directions, i.e., toward a side of the n-type cladding layer and a side of the p-type cladding layer. Therefore, in case of the nitride semiconductor light-emitting element in which light having passed through the n-type cladding layer is extracted from a rear side thereof, if part of the light propagating on the side of the p-type cladding layer reaches an interface with the p-electrode and reflected thereby without being absorbed by the p-type contact layer, the reflected light propagates toward the n-type cladding layer and is effectively used. By configuring in such a way that the light propagating toward the side of the p-type cladding layer is reflected and returned to the side of the n-type cladding layer with high efficiency, an amount of light extracted from the nitride semiconductor light-emitting element increases, and therefore the external quantum efficiency of the element is enhanced.

An attempt to improve the external quantum efficiency by efficiently reflecting light propagating on a side of a p-type cladding layer is disclosed in Patent Documents 1 and 2, and Non-Patent Document 3 described below.

According to the technique disclosed in Patent Document 1, a p-electrode to be electrically connected to a p-type contact layer is formed in a mesh pattern having apertures on the p-type contact layer, and a reflective layer using a metal such as silver or Al is formed on the p-type contact layer exposed in the apertures and the p-electrode, so that the external quantum efficiency is improved by providing a structure in which light having passed through a p-type cladding layer and a p-type contact layer is reflected toward the side of the active layer by the reflective layer formed in the apertures.

According to the technique disclosed in Patent Document 2, a high reflectivity metal layer making Ohmic contact with a p-type nitride semiconductor layer and having a mesh pattern with apertures is provided on the p-type nitride semiconductor layer, and further a metal barrier layer for assisting the reflection of the high reflectivity metal layer is provided on the p-type nitride semiconductor layer exposed in the apertures and the high reflectivity metal layer, so that the external quantum efficiency is improved by providing a structure in which light having passed through the p-type nitride semiconductor layer is reflected by an interface between the high reflectivity metal layer and the metal barrier layer.

According to the technique disclosed in Non-Patent Document 3, Pd electrodes of a nano-pixel type making Ohmic contact with a p-type nitride semiconductor layer are provided on the p-type nitride semiconductor layer, and further an Al reflective layer is formed in a gap between the Pd electrodes, so that the external quantum efficiency is improved by providing a structure in which light having passed through the p-type nitride semiconductor layer is reflected toward an active layer by the reflective layer formed in the gap.

PRIOR ART DOCUMENT

Patent Document

Patent Document 1: Japanese Unexamined Patent Application Publication No. 2008-66727
Patent Document 2: Japanese Unexamined Patent Application Publication No. 2005-210051

Non-Patent Document

Non-patent Document 1: Kentaro Nagamatsu, et al., "High-efficiency AlGaN-based UV light-emitting diode on laterally overgrown AlN," Journal of Crystal Growth, 2008, 310, pp. 2326-2329
Non-patent Document 2: Shigeaki Sumiya, et al., "AlGaN-Based Deep Ultraviolet Light-Emitting Diodes Grown on Epitaxial AlN/Sapphire Templates," Japanese Journal of Applied Physics, Vol. 47, No. 1, 2008, pp. 43-46

Non-patent Document 3: N. Lobo, et al., "Enhancement of light extraction in ultraviolet light-emitting diodes using nanopixel contact design with Al reflector," Applied Physics Letters, 96, 081109, 2010

SUMMARY OF THE INVENTION

Problems to be Solved by the Invention

In the nitride semiconductor light-emitting element of a rear surface emission type in which light having passed through the n-type cladding layer is extracted from a rear side thereof, all light is not emitted outside through a light exit surface, but part of the light is reflected toward the n-type cladding layer side. In a sectional structure of a conventional nitride semiconductor light-emitting element illustrated in FIG. 28, part of the reflected light reaches an n-electrode, another part thereof passes through an active layer and reaches a p-type cladding layer or a p-electrode, and both are absorbed and are not used effectively.

According to the conventional technique to improve the external quantum efficiency disclosed in Patent Document 1, Patent Document 2, and Non-Patent Document 3, the external quantum efficiency is improved by reflecting part of the light that can reach the p-electrode. However, this technique to improve the external quantum efficiency does not effectively function in the case where the light reaches the n-electrode or the light traveling toward the p-electrode is absorbed by the p-type cladding layer.

A nitride semiconductor ultraviolet light-emitting element has a double hetero structure in which an active layer (light-emitting layer) is held between a p-type cladding layer and an n-type cladding layer, an emission wavelength is determined by a band gap energy (band gap) of the active layer, an AlN molar fraction x of $Al_xGa_{1-x}N$ which constitutes each of the cladding layers is set larger than that of the active layer. As a result, the AlN molar fraction of each of the cladding layers becomes larger due to a shorter wavelength of the emission wavelength. For example, in the case where the center emission wavelength is around 280 nm, the AlN molar fraction of each of the cladding layers becomes about 60%, and, in the case where the center emission wavelength is around 250 nm, the AlN molar fraction of each of the cladding layers becomes about 75%.

When each of the AlN molar fractions of the p-type and n-type cladding layers configured of the AlGaN layer becomes larger, respective Ohmic contacts to the p-electrode and the n-electrode with a low resistance becomes difficult. Particularly, for the p-type cladding layer, when the AlN molar fraction exceeds 10% and becomes larger, high resistivity thereof becomes noticeable. For this reason, in the nitride semiconductor ultraviolet light-emitting element, the p-electrode is not normally formed directly on the p-type cladding layer. Instead, however, as illustrated in FIG. 28, a p-type contact layer of p-type GaN or the like that can make Ohmic contact with the p-electrode with a low resistance is formed on the p-type cladding layer, and the p-electrode is formed on the p-type contact layer.

In contrast, compared with the p-type cladding layer, since the n-type cladding layer can make Ohmic contact with the n-electrode until the AlN molar fraction becomes about 60% even if it exceeds 10%, normally, the n-electrode is directly formed on the n-type cladding layer without providing the n-type contact layer between the n-type cladding layer and the n-electrode. Further, a chip area occupied by a light-emitting element alone on a wafer substrate is a sum of an area of a first region in which a laminated structure from an active layer on the n-type cladding layer to a p-type contact layer is formed and an area of a second region in which the n-type cladding layer is exposed. Accordingly, it is preferable to make the area of the second region as small as possible to increase the external quantum efficiency per chip area. Since it is normal that the area of the second region per chip area can be kept smaller, and further a ratio of light that is reflected by the light exit surface and reaches the n-electrode having a small area is relatively small, effectively using the light by reflecting again the light reaching the n-electrode was not carried out.

However, in the nitride semiconductor light-emitting element of a rear surface emission type which is mounted on a package or the like by flip chip interconnection, it is necessary to secure a certain area of the second region, since a bump should be formed on the n-electrode. For this reason, the inventors of the present invention studied a possibility of effectively using the light by reflecting again the light that has been reflected by the light exit surface and reached the n-electrode, and found that there was a room for improving the external quantum efficiency by minimizing a formation region of the n-electrode on the second region, and forming a reflective electrode in a surplus portion in which the n-electrode is not formed.

In addition, in any of the conventional techniques to improve the external quantum efficiency as described above, a metal electrode having an opening which makes Ohmic contact with a p-type nitride semiconductor layer is formed on the p-type nitride semiconductor layer which forms an uppermost layer of a nitride semiconductor layer constituting the light-emitting element. Since the p-type nitride semiconductor layer forming the uppermost layer is formed on an entire surface above the active layer, it is necessary that emitted light is not absorbed by the p-type nitride semiconductor layer for reflecting the light emitted from the active layer by a reflective layer or a high reflectivity metal layer formed on the p-type nitride semiconductor layer.

However, for the metal electrode to make excellent Ohmic contact with the p-type nitride semiconductor layer, it is necessary that the uppermost layer be made of p-type GaN or AlGaN having an AlN molar fraction smaller than 10%. In particular, Patent Document 1 describes that it is necessary to use the p-type GaN, and Non-Patent Document 3 describes an embodiment using p-type GaN as the p-type nitride semiconductor layer of the uppermost layer. In such a case, when the emission wavelength from the active layer is about 355 nm or smaller, or further shorter wavelength, the light emission from the active layer is absorbed by the p-type nitride semiconductor layer of the uppermost layer. As a result, the light emission does not reach the reflective layer or the high reflectivity metal layer, or even if part of the light reaches there, reflected light is absorbed when it passes through the p-type nitride semiconductor layer again. Accordingly, the light is not effectively used, and therefore the external quantum efficiency is not improved. Consequently, the conventional techniques for improving the external quantum efficiency disclosed in Patent Documents 1 and 2, and Non-Patent Document 3 are not effective for the light-emitting element having an emission wavelength of 355 nm or smaller.

The present invention is made in view of the foregoing problem, and it is an object of the present invention to improve external quantum efficiency of a nitride semiconductor light-emitting element having a center emission wavelength of 355 nm or smaller.

Means for Solving the Problem

To achieve the object described above, the present invention has a first aspect in that a nitride semiconductor ultraviolet light-emitting element includes: an n-type cladding layer configured of an n-type AlGaN semiconductor layer; an active layer including an AlGaN semiconductor layer having a band gap energy of 3.4 eV or higher; a p-type cladding layer configured of a p-type AlGaN semiconductor layer and located above the active layer; an n-electrode metal layer making Ohmic contact with the n-type cladding layer; and a first reflective metal layer reflecting ultraviolet light emitted from the active layer, wherein the active layer and the p-type cladding layer are formed in a first region on the n-type cladding layer, the first region being in a plane parallel to a surface of the n-type cladding layer, the n-electrode metal layer is formed on an adjacent region to the first region, the adjacent region being in a second region which is a region other than the first region on the n-type cladding layer, the first reflective metal layer is formed on a surface of the n-type cladding layer in the second region other than the adjacent region, and the n-electrode metal layer is arranged between the first region and a region in which the first reflective metal layer contacts the surface of the n-type cladding layer.

In the present invention, the AlGaN semiconductor is based on a ternary compound (or binary compound) represented by a general formula of $Al_xGa_{1-x}N$ (x represents AlN molar fraction, where $0 \leq x \leq 1$), and is a group-III nitride semiconductor having band gap energy larger than band gap energy (about 3.4 eV) of GaN (where x=0), and includes a case where a minute amount of In is contained as long as a condition of the band gap energy is satisfied.

According to the nitride semiconductor ultraviolet light-emitting element having the first aspect, it is possible to improve extraction efficiency of emitted light which is extracted from a rear surface on a lower layer side of the n-type cladding layer in the nitride semiconductor ultraviolet light-emitting element of a rear surface emission type. Specifically, since part of light reflected toward the n-type cladding layer side without passing through the light exit surface of the rear surface is re-reflected toward the light exit surface by the first reflective metal layer, the re-reflected light can be effectively used, an amount of emitted light extracted from the light-emitting element actually increases, and the external quantum efficiency is improved.

In addition, it is preferable that, in the nitride semiconductor ultraviolet light-emitting element having the first aspect, the first reflective metal layer covers at least part of an upper surface of the n-electrode metal layer and makes electric contact with the n-electrode metal layer. With this arrangement, the n-electrode metal layer and the first reflective metal layer are integrated to be used as an electrode pad in a flip chip interconnection or the like.

Further, it is preferable that, in the nitride semiconductor ultraviolet light-emitting element having the first aspect, an AlN molar fraction of the n-type cladding layer is larger than an AlN molar fraction of the active layer, and is 60% or smaller.

FIG. 1 is measurement data serving as a basis of the present invention and illustrates a measurement result of a relation between a contact resistance $\rho c$ (unit: $\Omega cm^2$) between the n-electrode (Ti/Al/Ti/Au where lowermost layer is made of Ti and uppermost layer is made of Au) formed on an n-type $Al_xGa_{1-x}N$ layer and the n-type AlGaN layer, and a heat treatment temperature T (unit: ° C.) for five cases where the AlN molar fraction x of the n-type AlGaN layer is 0%, 25%, 40%, 60%, and 75%. Each point illustrated in FIG. 1 is plotted using an average value of the contact resistances of a plurality of samples having an identical AlN molar fraction and subjected to an identical heat treatment temperature, and a curved broken line indicates a tendency of a change of the individual points for the sake of convenience. Here, the measurement of the contact resistance is conducted by the publicly known TLM (Transmission Line Model) method. The heat treatment temperature is set within a range from 450° C. to 1000° C., and a sample whose AlN molar fraction x is 0% is measured also in the case where no heat treatment is applied. The sample whose AlN molar fraction x is 0% presents the same contact resistance both in the case where the heat treatment is not applied and the case where the heat treatment is applied at a temperature of 450° C. As for the sample whose AlN molar fraction x is 75%, the contact resistance is 200 times larger or more in average at the heat treatment temperature of 950° C. as compared with the sample whose AlN molar fraction x is 60%, excellent Ohmic contact is not formed, and no Ohmic contact is provided at the heat treatment temperature of 900° C. or lower. Further, as for the sample whose AlN molar fraction x is 75%, a variation in the contact resistance is large, and furthermore a contact resistance which is higher by double digits is also measured.

As illustrated in the measurement result of FIG. 1, when the AlN molar fraction x of the n-type cladding layer is 60% or smaller, it is understood that the contact resistance $\rho c$ can be adjusted to be 0.01 $\Omega cm^2$ or smaller, and excellent Ohmic contact can be formed by appropriately selecting the heat treatment temperature T.

Further, in the nitride semiconductor ultraviolet light-emitting element having the first aspect, it is preferable that the first reflective metal layer is configured of Al, or a metal multilayer film or an alloy including Al as a main component.

Furthermore, the nitride semiconductor ultraviolet light-emitting element having the first aspect has a second aspect in that a p-type contact layer configured of a p-type AlGaN semiconductor layer that absorbs the ultraviolet light is formed on the p-type cladding layer, the p-type contact layer includes an opening portion that penetrates to a surface of the p-type cladding layer, a p-electrode metal layer that makes Ohmic contact or non-rectifying contact with the p-type contact layer is formed on the p-type contact layer so as not to completely cover the opening portion, a second reflective metal layer that reflects the ultraviolet light is formed at least on the opening portion, and the second reflective metal layer covers the surface of the p-type cladding layer exposed through the opening portion either directly or through a transparent insulating layer that allows the ultraviolet light to pass therethrough.

According to the nitride semiconductor ultraviolet light-emitting element having the second aspect, part of the ultraviolet light emitted from the active layer and passed through the p-type cladding layer enters the opening portion of the p-type contact layer, and reliably reaches and is reflected by the second reflecting metal layer without being absorbed by the p-type contact layer, so that the reflected light can be effectively used, and external quantum efficiency can be improved.

Further, since the p-type contact layer and the p-electrode metal layer make Ohmic contact or non-rectifying contact with each other, a current path leading from the p-electrode metal layer through the p-type contact layer and the p-type cladding layer to the active layer is provided. The inventors of the present invention checked in the examples which will be described later that the current path was sufficiently provided, and excellent light emission was performed even if the p-type contact layer was not formed entirely above the active layer. In the nitride semiconductor ultraviolet light-emitting element having a center emission wavelength of 355 nm or smaller, an AlN molar fraction of the p-type cladding layer increases beyond 10%, and the p-type cladding layer cannot make Ohmic contact or non-rectifying contact with the p-electrode metal layer with a low resistance. Therefore, there is a meaning for providing a p-type contact layer that can make Ohmic contact or non-rectifying contact with the p-electrode metal layer.

In addition, in the nitride semiconductor ultraviolet light-emitting element having the second aspect, it is preferable that an AlN molar fraction of the p-type contact layer is 0% or larger and smaller than 10%. If the AlN molar fraction of the p-type contact layer is 0% or larger and smaller than 10%, it is possible to make Ohmic contact or non-rectifying contact in a low resistance with the p-electrode metal layer. Particularly, it is possible to make excellent Ohmic contact in a low resistance by using p-type GaN having the AlN molar fraction of 0%.

Further, in the nitride semiconductor ultraviolet light-emitting element having the second aspect, it is preferable that the reflective metal layer is formed at least on the opening portion and the p-electrode metal layer. In the case where the p-electrode metal layers are discretely formed, by forming the reflective metal layer also on the p-electrode metal layer, it is possible to connect the discrete p-electrode metal layers with one another and realize a function as an integrated p-electrode.

Further, in the nitride semiconductor ultraviolet light-emitting element having the second aspect, it is preferable that the reflective metal layer is configured of Al, or a metal multilayer film or an alloy including Al as a main component.

Furthermore, in the nitride semiconductor ultraviolet light-emitting element having the second aspect, it is preferable that a ratio of an area of the opening portion to a total area of the p-type contact layer and the opening portion is 66% or more. As the ratio is higher, an amount of reflected light increases. In this case, although the external quantum efficiency increases, a parasitic resistance on the p-electrode side increases and a forward voltage increases to a higher voltage. Accordingly, when the ratio is too high, there may be a case where light-emitting efficiency with respect to a power inputted between an anode and a cathode of the light-emitting element is reduced. When the ratio is 66%, the light-emitting efficiency is not reduced, and the external quantum efficiency can be improved within a range in which a practical forward voltage is realized. Since it is necessary to secure a certain area for the p-electrode metal layer for applying a forward voltage to the light-emitting element, a predetermined value smaller than 100% is determined as an upper limit of the ratio in accordance with a range in which the area and a practical forward voltage can be realized.

Furthermore, in the nitride semiconductor ultraviolet light-emitting element according to the first or second aspect, it is preferable that the n-type cladding layer is formed on a template allowing the ultraviolet light to pass therethrough and configured of an insulator layer, a semiconductor layer, or a laminated body of the insulator layer and the semiconductor layer, and it is also preferable that the template includes an AlN layer. This arrangement makes it possible to allow the emitted light to pass through the template while the template is included, and extract the emitted light from the rear side.

Effect of the Invention

According to the nitride semiconductor ultraviolet light-emitting element having the aspects described above, it is also possible to reliably improve the external quantum efficiency for the emitted light having a center wave length of 355 nm or smaller, which was otherwise difficult by the conventional technique to improve the external quantum efficiency.

BRIEF DESCRIPTION OF THE DRAWINGS

FIG. 3A illustrates the first region R1 and the second region R2 prior to formation of each of the electrodes. FIGS. 3B and 3C each illustrate planar patterns of the n-electrode and the reflective electrode. A portion of the n-electrode is distinguished by hatching in FIG. 3B, and a portion of the reflective electrode is distinguished by hatching in FIG. 3C.

FIG. 16 is a table indicating measurement results on emission intensity, forward voltage, and conversion efficiency in an example in which an n-electrode and a reflective electrode are provided on an n-type cladding layer and a comparative example in which an n-electrode is provided on an n-type cladding layer but without a reflective electrode, in the cases where Al molar fractions of the n-type cladding layer are 55% and 20%.

FIGS. 18A, 18B, and 18C illustrate one example of a planar pattern of the p-electrode with the p-electrode in the grid pattern in FIG. 18A, in the comb-like pattern in FIG. 18B, and in the dot-like pattern in FIG. 18C.

FIG. 25 is a table indicating measurement results on emission intensity, a forward voltage, and conversion efficiency in an example in which a reflective electrode is provided in a structural portion of a p-electrode and a comparative example in which a reflective electrode is not provided in a structural portion of a p-electrode.

MODE FOR CARRYING OUT THE INVENTION

Figure 1:
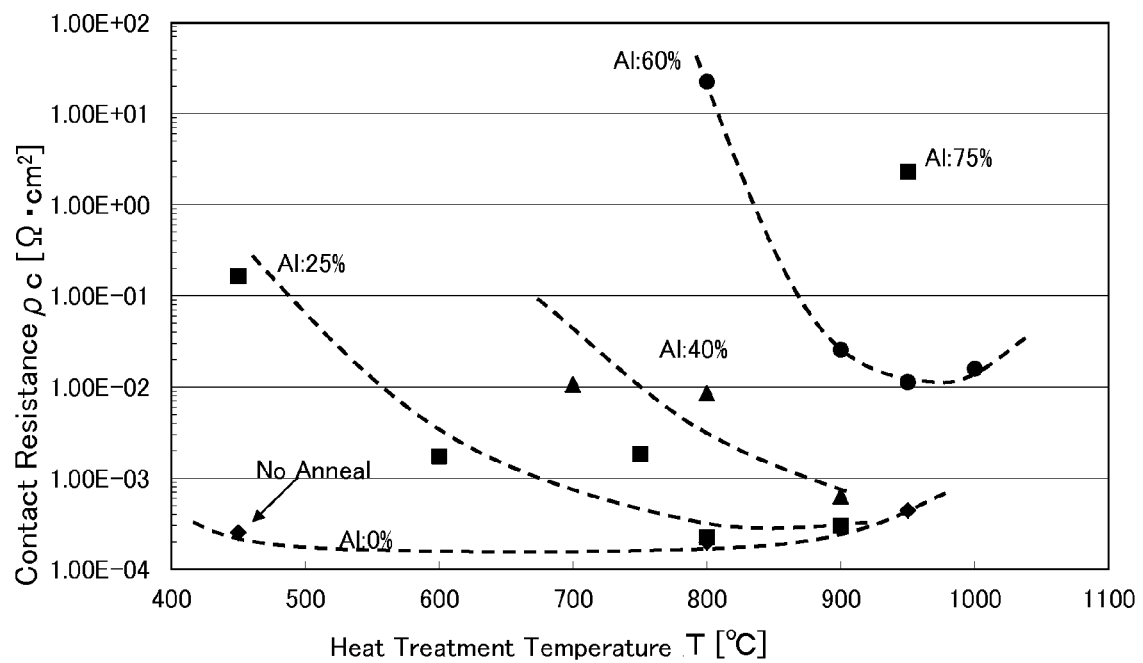
FIG. 1 is a characteristics chart indicating a measurement result of a relation among a contact resistance between an n-electrode formed on an n-type AlGaN layer and the n-type AlGaN layer, a heat treatment temperature T, and an AlN molar fraction of the n-type AlGaN layer.

An embodiment of a nitride semiconductor ultraviolet light-emitting element (hereinafter, arbitrarily referred to as "an inventive element") will be described with reference to the drawings. It should be noted that, since the invention is schematically illustrated by emphasizing a principal portion in the drawings used for the description to facilitate understanding of the description, dimensional proportions of individual portions are not necessarily equivalent to those of the actual element. Hereinafter, a description will be given by assuming that the element of the present invention is a light-emitting diode.

First Embodiment

Figure 2:
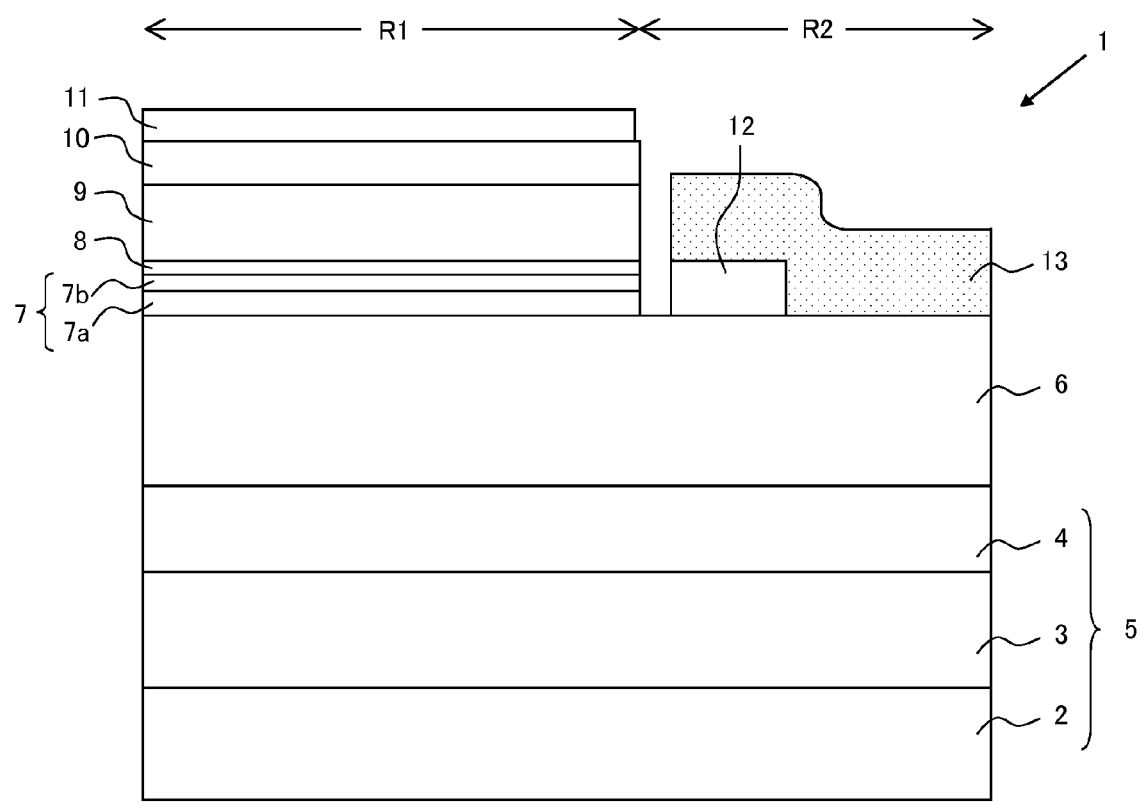
FIG. 2 is a cross sectional view schematically illustrating a laminated structure of a nitride semiconductor ultraviolet light-emitting element according to a first embodiment of the present invention

As illustrated in FIG. 2, an inventive element 1 uses a substrate in which an AlN layer 3 and an AlGaN layer 4 are grown on a sapphire (0001) substrate 2 that serves as a template 5, and has a laminated structure formed by sequentially laminating, on the template 5, an n-type cladding layer 6 of n-type AlGaN, an active layer 7, an electron block layer 8 of p-type AlGaN whose Al molar fraction is greater than that of the active layer 7, a p-type cladding layer 9 of p-type AlGaN, and a p-type contact layer 10 of p-type GaN. The active layer 7, the electron block layer 8, the p-type cladding layer 9, and the p-type contact layer 10 which are located above the n-type cladding layer 6 are partially removed by reactive ion etching until a surface of the n-type cladding layer 6 is partially exposed, and a laminated structure including layers starting from the active layer 7 to the p-type contact layer 10 is formed in a first region (R1) on the n-type cladding layer 6. In addition, the active layer 7 has a single-layer quantum well structure configured of, as an example, an n-type AlGaN barrier layer 7a having a film thickness of 10 nm and a well layer 7b of AlGaN having a film thickness of 3.5 nm. The active layer 7 may be of a double heterojunction structure sandwiched between n-type and p-type AlGaN layers having a larger Al molar fraction at lower and upper sides, or may be of a multi-quantum well structure resulted from multi-layering the single-layer quantum well structure.

Each of the AlGaN layers is formed by a well-known epitaxial growth method such as s metalorganic vapor phase epitaxy (MOVPE) growth method or a molecular beam epitaxy (MBE) method, and, for example, Si is used as a donor impurity of an n-type layer, and, for example, Mg is used as an acceptor impurity of a p-type layer. It should be noted that the AlN layer and the AlGaN layer whose conductivity types are not described are undoped layers into which no impurities are injected. Further, the AlN molar fractions of the n-type AlGaN layer and the active layer are, for example, arranged as 60% for the AlGaN layer 4, the n-type cladding layer 6, and the barrier layer 7a, and 35% for the well layer 7b. A film thickness of each of the AlGaN layers excluding the active layer 7 is, for example, 2000 nm for the n-type cladding layer 6, 2 nm for the electron block layer 8, 540 nm for the p-type cladding layer 9, and 200 nm for the p-type contact layer 10.

A p-electrode 11 (corresponding to a p-electrode metal layer) made of, for example, Ni/Au is formed on a surface of the p-type contact layer 10, an n-electrode 12 (corresponding to an n-electrode metal layer) made of, for example, Ti/Al/Ti/Au is formed on part of a surface of the n-type cladding layer 6, and a reflective electrode 13 (corresponding to a first reflective metal layer) made of, for example, Al/Ti/Au is formed on part of an exposed surface of the n-type cladding layer 6 which is not covered with the n-electrode 12. In this embodiment, since the n-electrode 12 is formed on the n-type cladding layer 6 in a manner to directly make Ohmic contact, it is preferable that the AlN molar fraction of the n-type cladding layer 6 is 60% or smaller based on the measurement result indicated in FIG. 1.

Figure 3A:
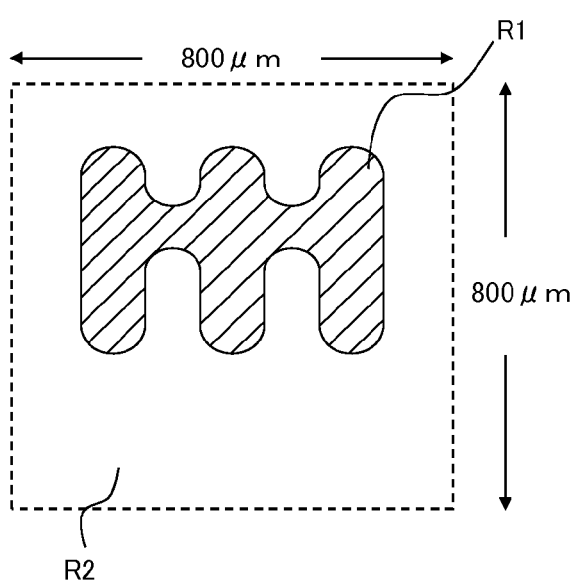
FIGS. 3A-3C are plan views schematically illustrating a planar structure of the nitride semiconductor ultraviolet light-emitting element, and a planar pattern of an n-electrode, a p-electrode, and a reflective electrode according to the first embodiment of the present invention.
Figure 3B:
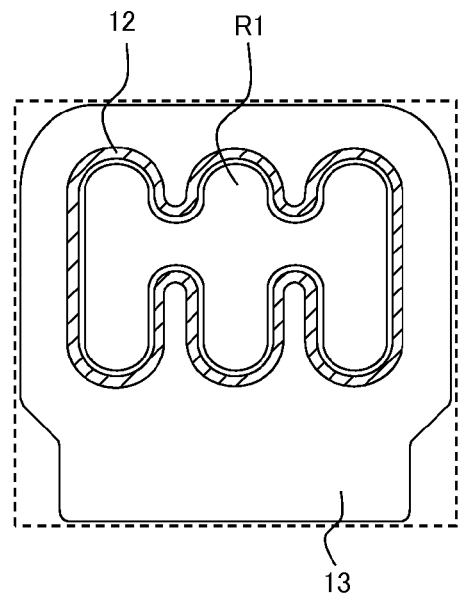
Figure 3C:
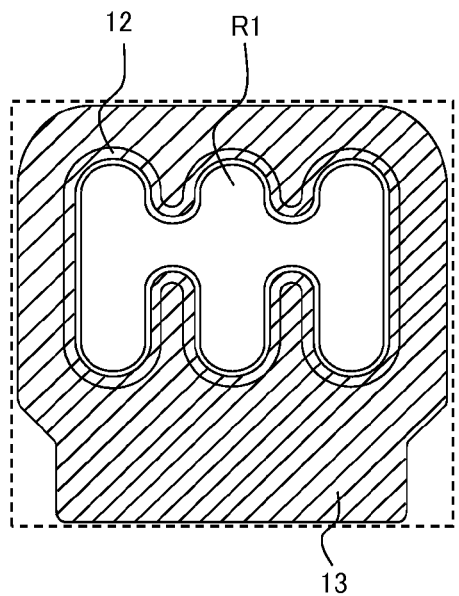

FIG. 3 illustrates one example of planar patterns of the p-electrode 11, the n-electrode 12, and the reflective electrode 13. FIG. 3(a) illustrates the first region R1 and the second region R2 prior to formation of each of the electrodes 11 to 13. The p-electrode 11 is formed on a substantially entire surface of the first region R1. The second region corresponds to a region excluding the first region on the n-type cladding layer 6. A chip size of the inventive element 1 illustrated in FIG. 3 is 800 μm both in height and width and an area of the first region R1 is about 168000 μm². FIGS. 3(b) and 3(c) each illustrate planar patterns of the n-electrode 12 and the reflective electrode 13. A portion of the n-electrode 12 is distinguished by hatching in FIG. 3(b), and a portion of the reflective electrode 13 is distinguished by hatching in FIG. 3(c). As illustrated in FIGS. 2, 3(b), and 3(c), the reflective electrode 13 is formed on an upper surface of the n-electrode 12 in an overlapping manner, and the reflective electrode 13 and the n-electrode 12 are electrically connected to each other. In addition, the n-electrode 12 is formed along an inner periphery of the reflective electrode 13 which faces the first region R1. To state it differently, the n-electrode 12 is formed on an adjacent region to the first region R1, and is formed to surround the first region R1 in an annular pattern in the example illustrated in FIG. 2. Then, a contact surface between the reflective electrode 13 and the n-type cladding layer 6 is formed outside the n-electrode 12 so as to cover almost an entire surface of a region of the first region R2 in which the n-electrode 12 is not formed (at a side far from the first region R1), and all of the n-electrodes 12 are formed inside the contact surface (a side close to the first region R1). Here, in the example illustrated in FIGS. 3(b) and 3(c), a contact area between the n-electrode 12 and the n-type cladding layer 6 and a contact area between the reflective electrode 13 and the n-type cladding layer 6 are 58000 μm² and 313000 μm², respectively, which correspond to about 35% and 186% of an area of the first region R1 (active layer 7), respectively.

Figure 28:
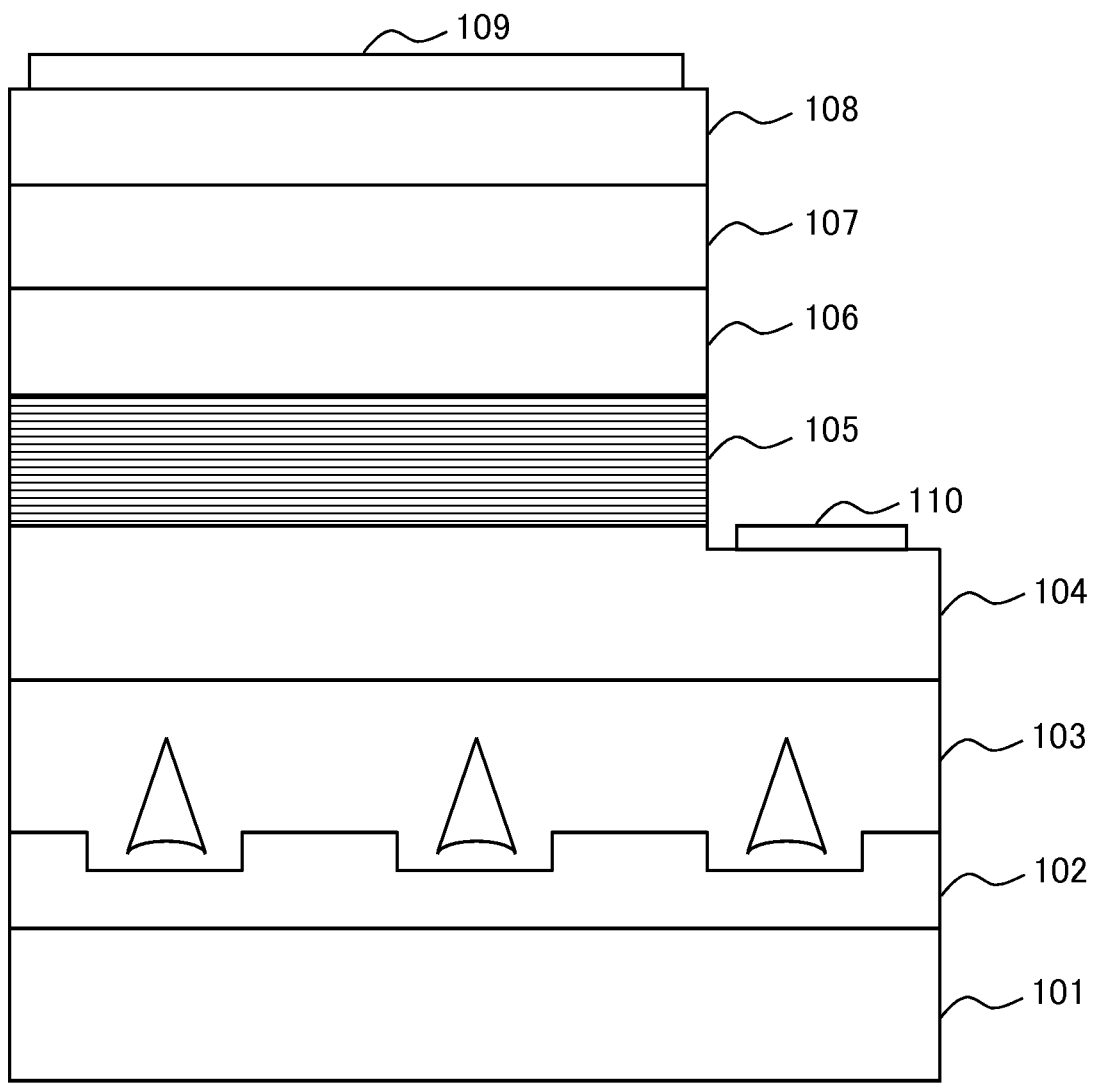
FIG. 28 is a cross sectional view schematically illustrating a crystal layer structure of a conventional AlGaN light-emitting diode.

The element structure illustrated in FIG. 2 is basically the same as the element structure of the conventional light-emitting diode illustrated in FIG. 28 excluding the n-electrode 12 and the reflective electrode 13. Therefore, this inventive element 1 is characterized by the structure of the n-electrode including the n-electrode 12 and the reflective electrode 13.

Next, a method for manufacturing the inventive element 1 will be described. FIGS. 4 to 9 illustrate cross sectional views in principal manufacturing steps.

Figure 4:
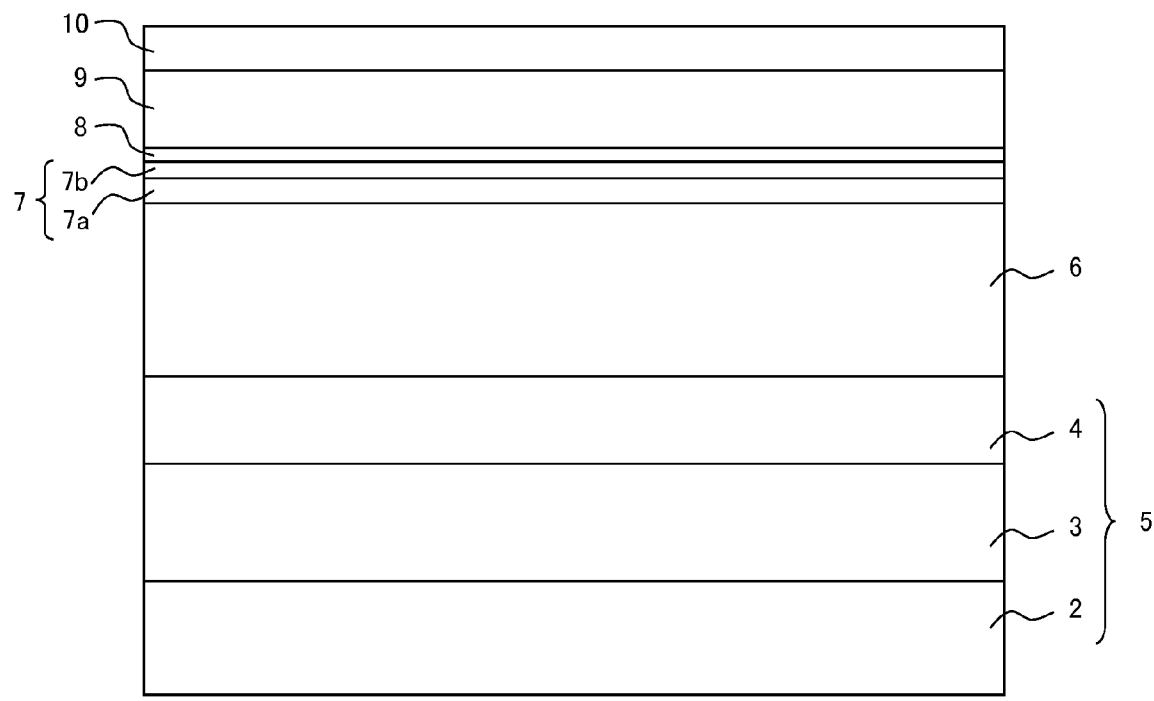
FIG. 4 is a cross sectional view schematically illustrating a laminated structure in a manufacturing step (after depositing a p-type contact layer) of the nitride semiconductor ultraviolet light-emitting element according to the first embodiment of the present invention.
Figure 5:
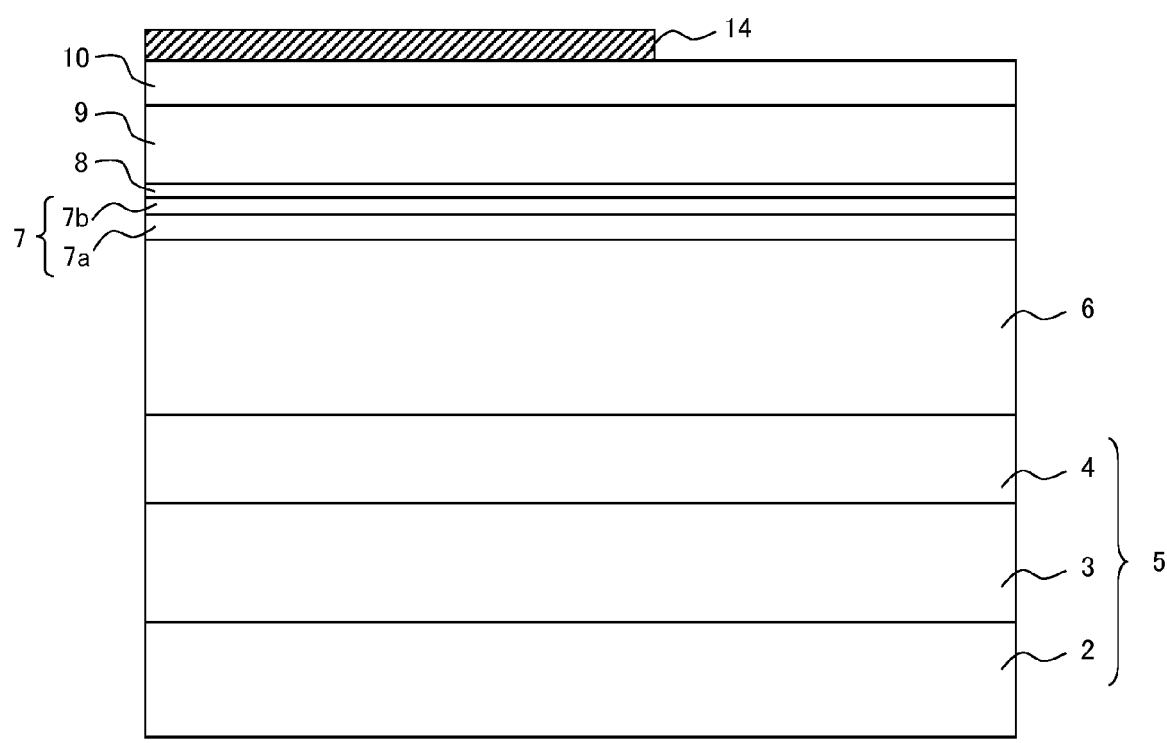
FIG. 5 is a cross sectional view schematically illustrating a laminated structure in a manufacturing step (after a Ni mask is covered) of the nitride semiconductor ultraviolet light-emitting element according to the first embodiment of the present invention.
Figure 6:
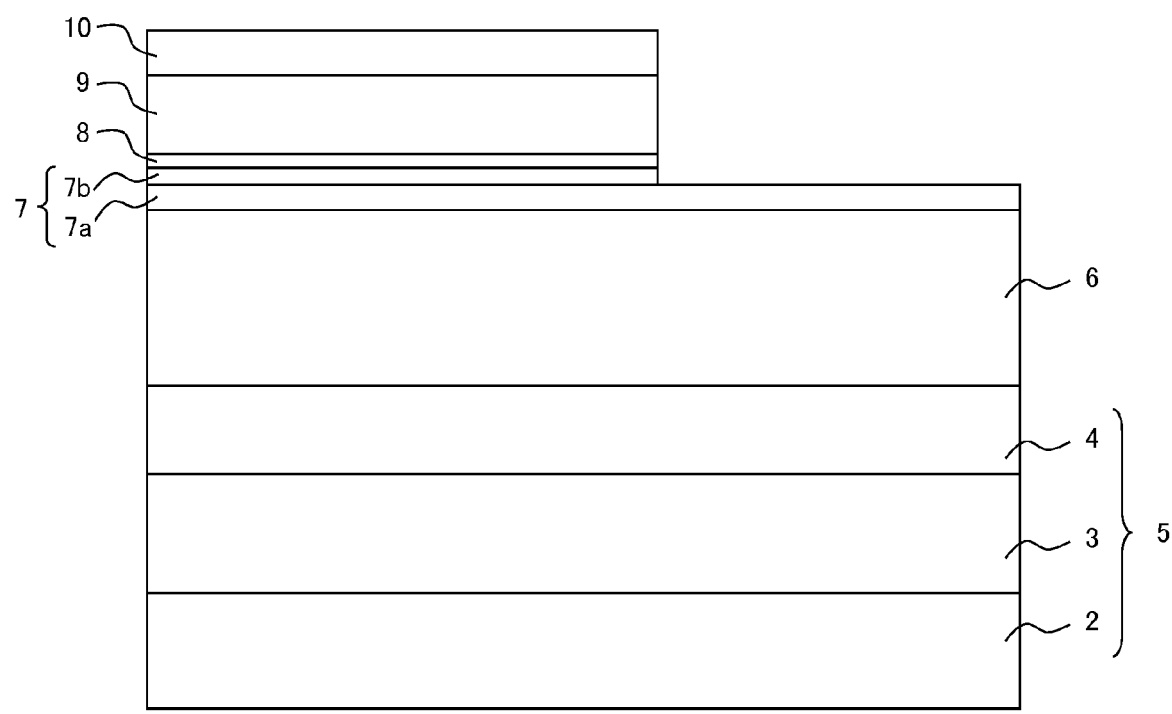
FIG. 6 is a cross sectional view schematically illustrating a laminated structure in a manufacturing step (after exposing a surface of an n-type cladding layer) of the nitride semiconductor ultraviolet light-emitting element according to the first embodiment of the present invention.

First, as illustrated in FIG. 4, the template 5 and each layer starting from the n-type cladding layer 6 to the p-type contact layer 10 are formed by the well-known growth method as described above. After the p-type contact layer 10 is formed, heat treatment, for example, at 800° C. is applied for activating Mg which is an acceptor impurity. Next, as illustrated in FIG. 5, the first region on a surface of the p-type contact layer 10 is covered with, for example, an Ni mask 14 by the well-known photolithography technique. Thereafter, as illustrated in FIG. 6, a portion positioned on the second region of each of the layers from the active layer 7 to the p-type contact layer 10 deposited on an entire surface on the n-type cladding layer 6 is removed by the well-known anisotropic etching method such as reactive ion etching, and the Ni mask 14 is removed after the surface of the n-type cladding layer 6 is exposed.

Figure 7:
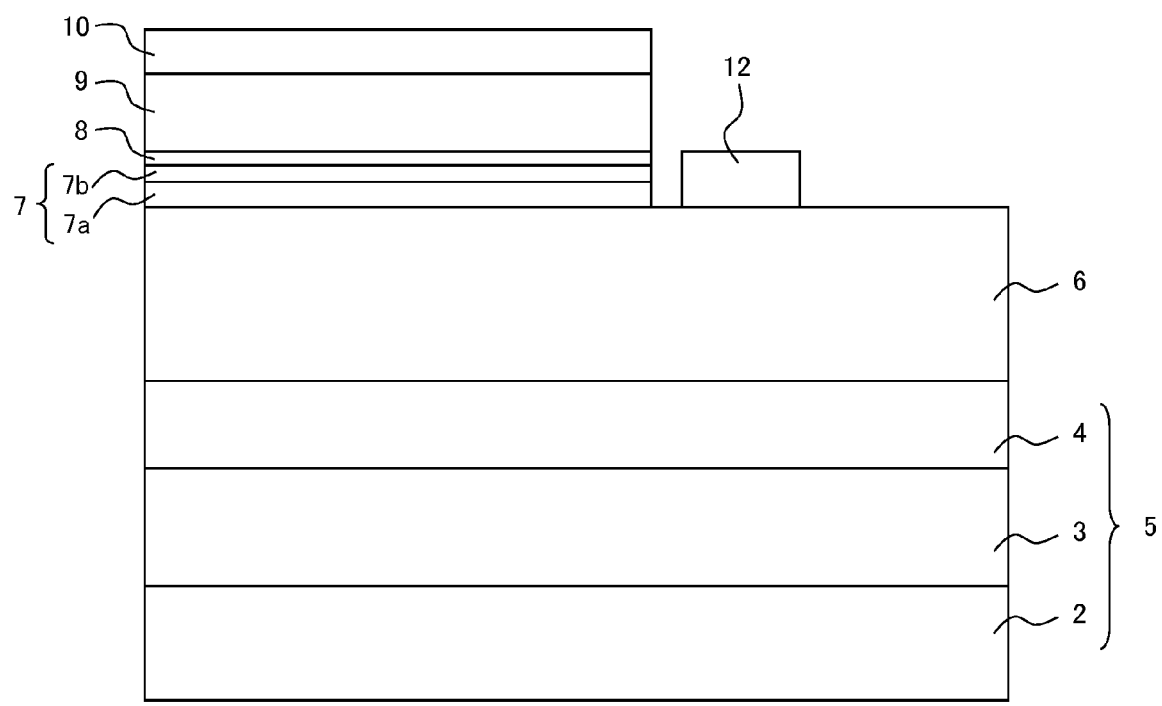
FIG. 7 is a cross sectional view schematically illustrating a laminated structure in a manufacturing step (after forming an n-electrode) of the nitride semiconductor ultraviolet light-emitting element according to the first embodiment of the present invention.

Subsequently, a photoresist (not illustrated) having a reverse pattern of that of the n-electrode 12 is formed on an entire surface of the substrate, a four-layer metal film of Ti/Al/Ti/Au serving as the n-electrode 12 is deposited thereon by an electron-beam evaporation method or the like, the four-layer metal film on the photoresist is exfoliated by removing the photoresist by a liftoff process, and heat treatment is applied by RTA (Rapid Thermal Annealing) or the like so as to form the n-electrode 12 on the n-type cladding layer 6, as illustrated in FIG. 7. Film thicknesses of the four-layer metal film of Ti/Al/Ti/Au are, for example, 20 nm, 100 nm, 50 nm, and 100 nm, respectively, in this order. Here, the heat treatment is performed for the purpose of reducing the contact resistance. It is preferable that a temperature for the heat treatment is set by considering the relation or the like illustrated in FIG. 1 so that a contact resistance between the n-electrode 12 and the n-type cladding layer 6 becomes the lowest in accordance with the AlN molar fraction of the n-type cladding layer 6.

Figure 8:
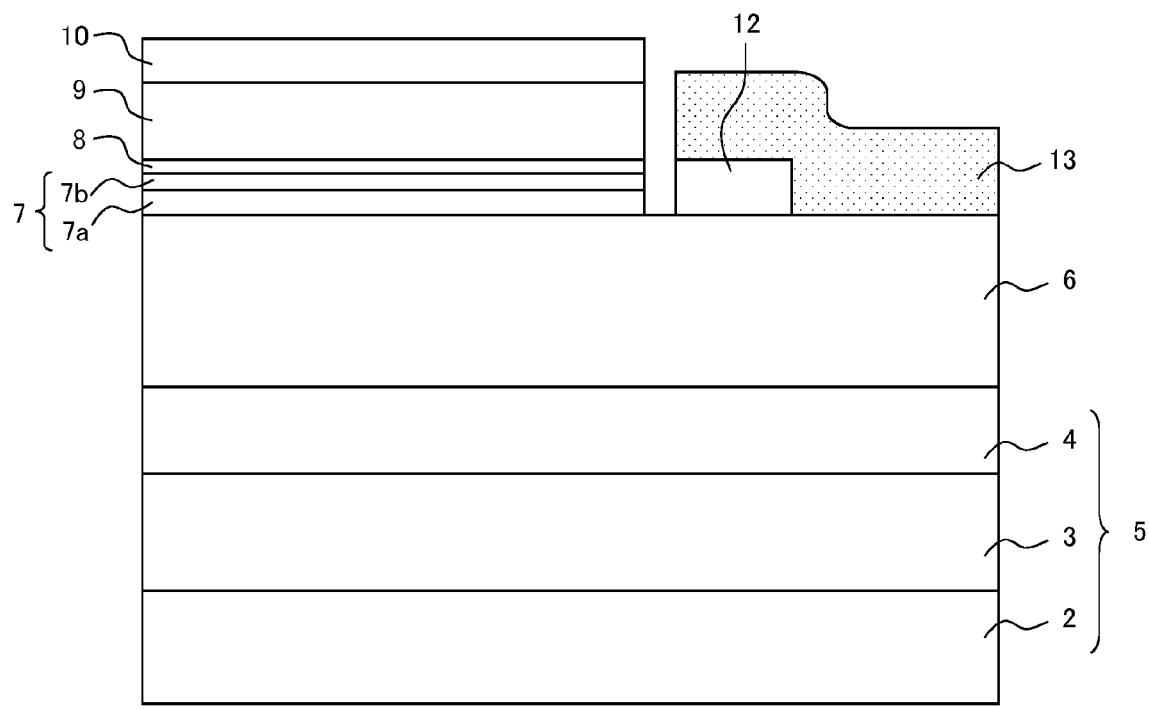
FIG. 8 is a cross sectional view schematically illustrating a laminated structure in a manufacturing step (after forming a reflective electrode in a structural portion of the n-electrode) of the nitride semiconductor ultraviolet light-emitting element according to the first embodiment of the present invention.

Subsequently, a photoresist (not illustrated) having a reverse pattern of that of the reflective electrode 13 is formed on an entire surface of the substrate, a three-layer metal film of Al/Ti/Au serving as the reflective electrode 13 is deposited thereon by an electron-beam evaporation method or the like, the three-layer metal film on the photoresist is exfoliated by removing the photoresist by a liftoff process, and the reflective electrode 13 is formed on an substantially entire surface of the second region so as to cover the n-electrode 12 (or at least part of the n-electrode 12), as illustrated in FIG. 8. Film thicknesses of the three-layer metal film of Al/Ti/Au are, for example, 100 nm, 100 nm, and 200 nm, respectively, in this order. The reflective metal layer 13 formed directly on the n-type cladding layer 6 without coating the n-electrode 12 mainly contains Al that reflects the ultraviolet ray. Accordingly, the reflective metal layer 13 reflects again, toward the side of the sapphire substrate 2, light emission that is reflected by a sapphire substrate 2 side, passes through the n-type cladding layer 6, and reaches the second region on the surface of the n-type cladding layer 6. Here, heat treatment is not applied to the reflective electrode 13. As a result, the Al layer in the reflective electrode 13 is not melted by the heat treatment, and therefore a function of reflecting the ultraviolet ray is satisfactorily maintained. In addition, since the reflective electrode 13 makes Ohmic contact with the n-electrode 12, it can be used as an electrode pad for flip-chip bonding, wire bonding, or the like in the vicinity of the chip.

Figure 9:
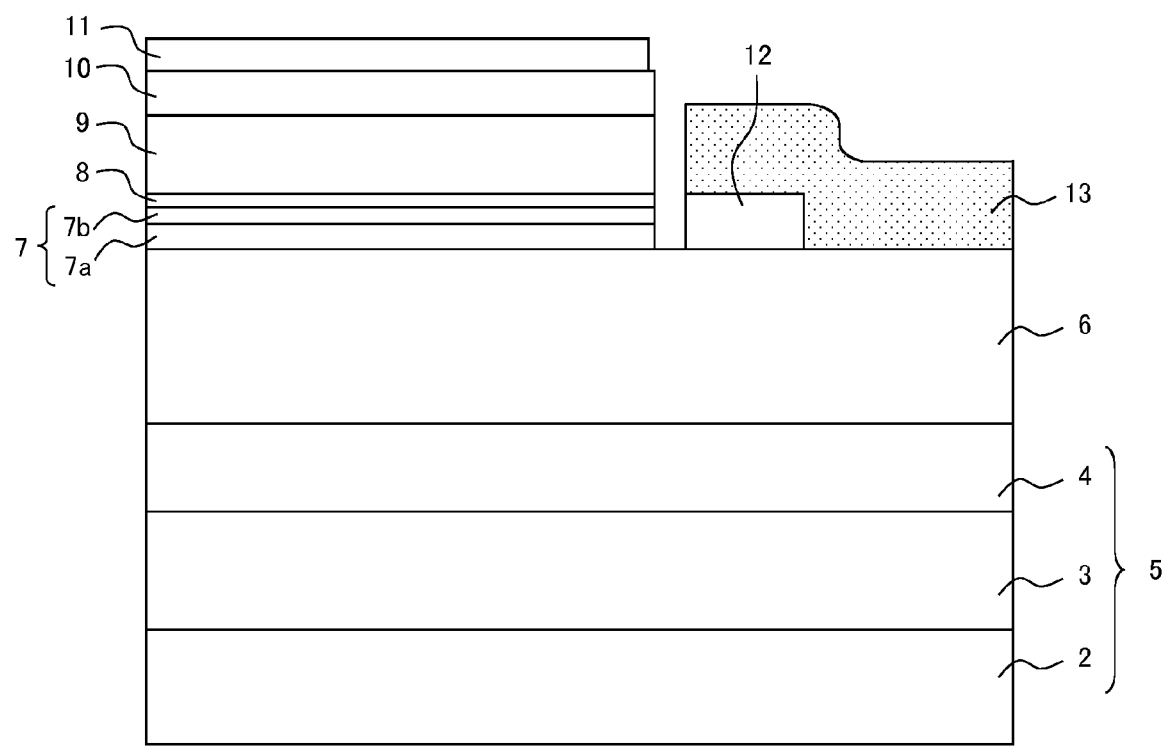
FIG. 9 is a cross sectional view schematically illustrating a laminated structure in a manufacturing step (after forming a p-electrode) of the nitride semiconductor ultraviolet light-emitting element according to the first embodiment of the present invention.

Subsequently, a photoresist (not illustrated) having a reverse pattern of that of the p-electrode 11 is formed on an entire surface of the substrate, a two-layer metal film of Ni/Au serving as the p-electrode 11 is deposited thereon by an electron-beam evaporation method or the like, the two-layer metal film on the photoresist is exfoliated by removing the photoresist by a liftoff process, and heat treatment is applied, for example, at a temperature of 450° C. by RTA (Rapid Thermal Annealing) or the like so as to form the p-electrode 11 on the p-type contact layer 10, as illustrated in FIG. 9. Film thicknesses of the two-layer metal film of Ni/Au are, for example, 60 nm and 50 nm, respectively, in this order. Here, in the heat treatment process at the temperature of 450° C., since the melting point of Al is about 660° C., the Al layer in the reflective electrode 13 never melts.

Figure 10:
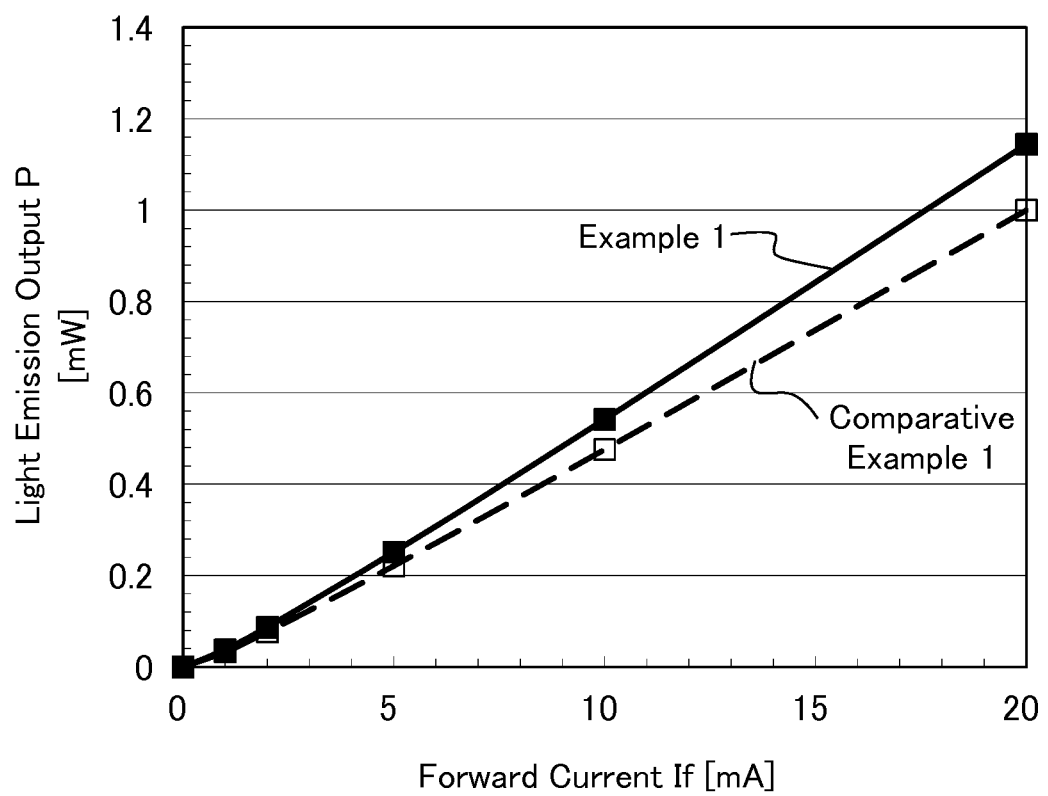
FIG. 10 is a characteristics chart indicating measurement results of characteristics of a light emission output with respect to a forward current in an example in which an n-electrode and a reflective electrode are provided on an n-type cladding layer and a comparative example in which an n-electrode is provided on an n-type cladding layer but without a reflective electrode, in the case where an Al molar fraction of the n-type cladding layer is 55%.
Figure 11:
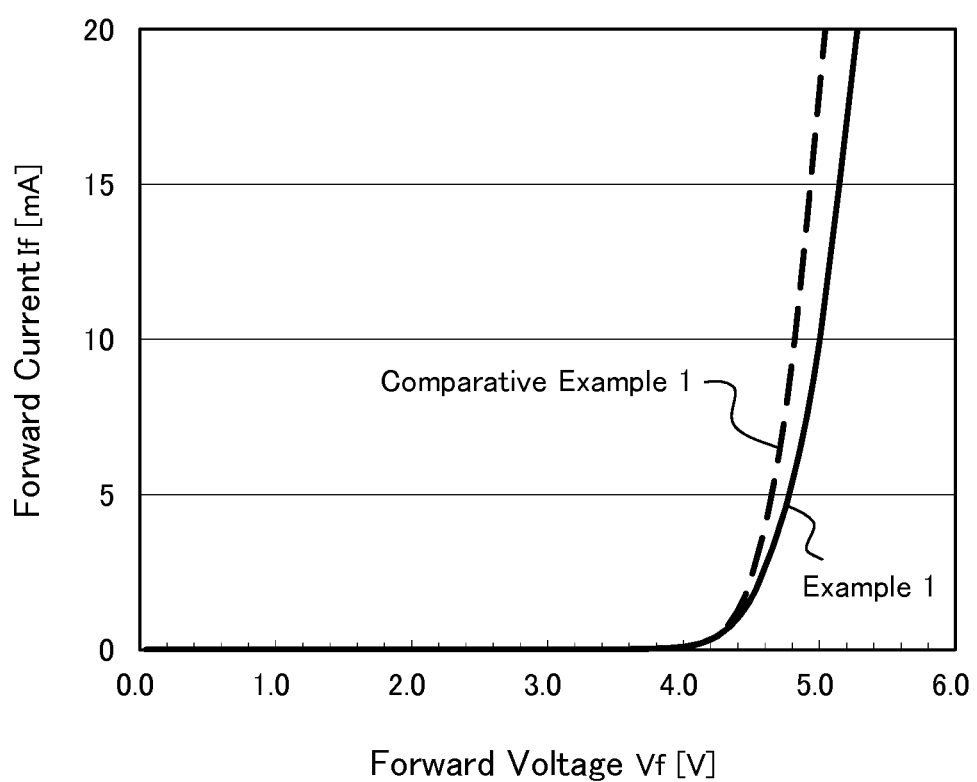
FIG. 11 is a characteristics chart indicating measurement results of current-voltage characteristics between a forward voltage and a forward current in an example in which the n-electrode and the reflective electrode are provided on the n-type cladding layer and a comparative example in which the n-electrode is provided on the n-type cladding layer but without the reflective electrode, in the case where an Al molar fraction of the n-type cladding layer is 55%.
Figure 12:
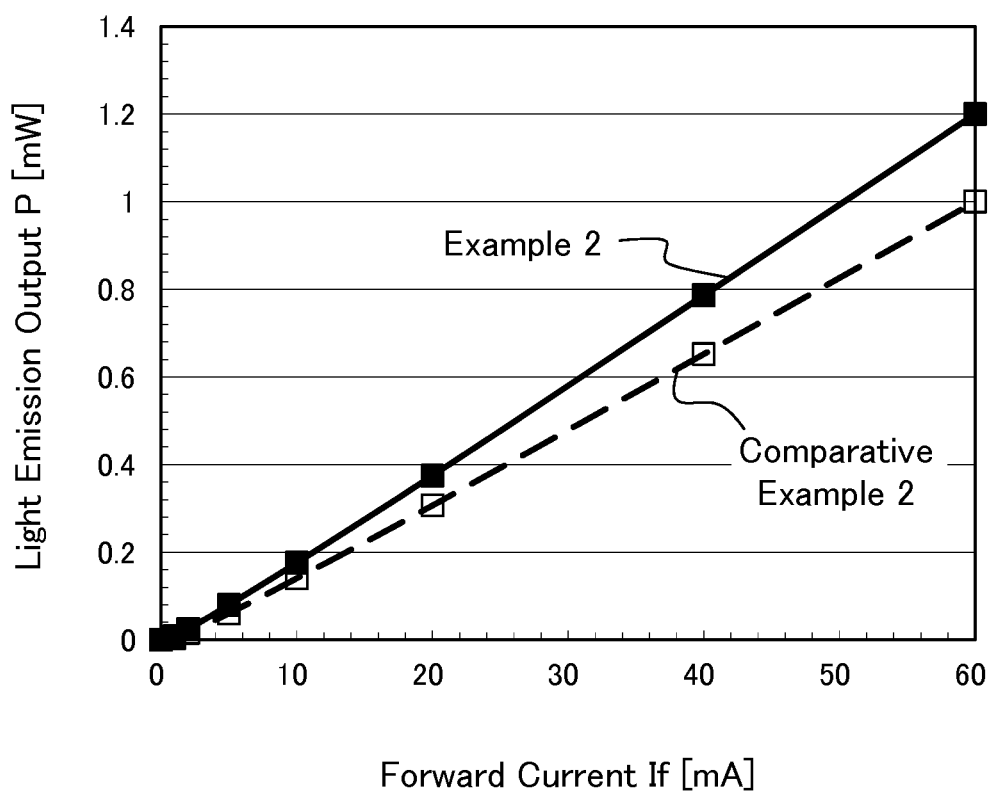
FIG. 12 is a characteristics chart indicating measurement results of characteristics of a light emission output with respect to a forward current in an example in which an n-electrode and a reflective electrode are provided on an n-type cladding layer and a comparative example in which an n-electrode is provided on an n-type cladding layer but without a reflective electrode, in the case where the Al molar fraction of the n-type cladding layer is 20%.
Figure 13:
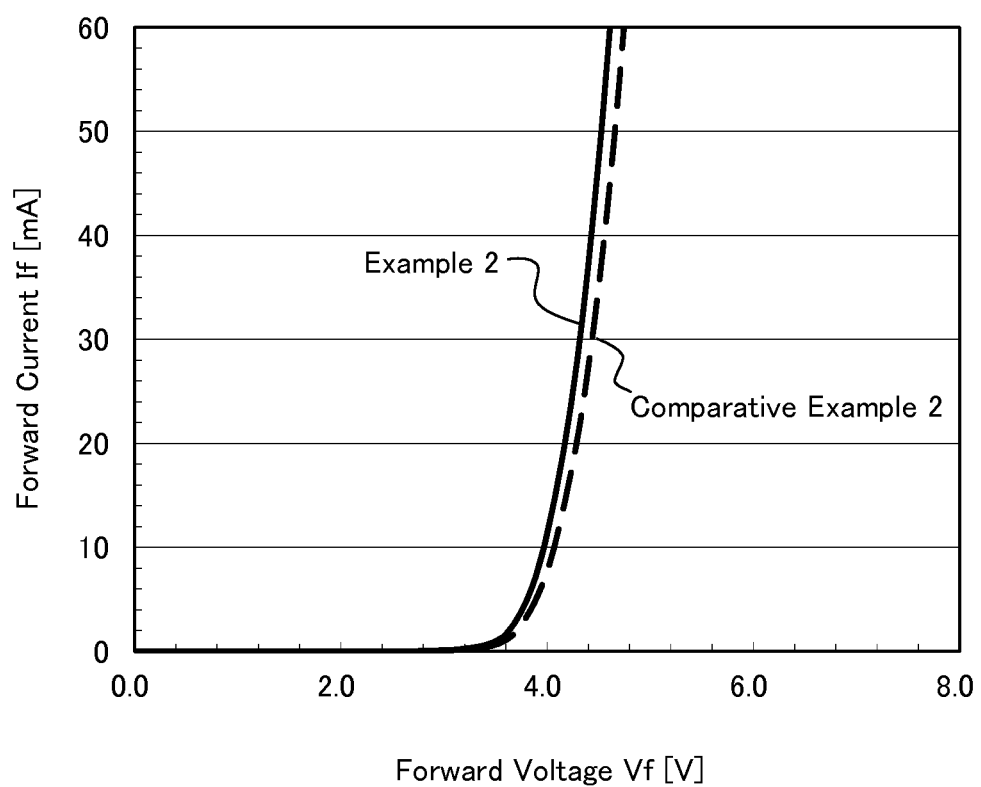
FIG. 13 is a characteristics chart indicating measurement results of current-voltage characteristics between a forward voltage and a forward current in an example in which the n-electrode and the reflective electrode are provided on the n-type cladding layer and a comparative example in which the n-electrode is provided on the n-type cladding layer but without the reflective electrode, in the case where an Al molar fraction of the n-type cladding layer is 20%.

Next, FIGS. 10 to 13 illustrate measurement results of characteristics of a light emission output P (unit: mW) with respect to a forward current If (unit: mA), and current-voltage characteristics between a forward voltage Vf (unit: V) and a forward current If in Examples 1 and 2 of the inventive element 1 in which the n-electrode 12 and the reflective electrode 13 having the planar patterns as illustrated in FIG. 3 are formed on the n-type cladding layer 6, and Comparative Examples 1 and 2 in which only the n-electrode 12 having a planar pattern identical with that of the reflective electrode 13 is formed on the n-type cladding layer 6. The Al molar fraction of the n-type cladding layer 6 of each sample is evaluated for two types, i.e., 55% (Example 1 and Comparative Example 1) and 20% (Example 2 and Comparative Example 2). FIGS. 10 and 11 illustrate individual measurement results in Example 1 and Comparative Example 1 as comparison targets, and FIGS. 12 and 13 illustrate individual measurement results on Example 2 and Comparative Example 2 as comparison targets. In each of the drawings, the measurement results of Examples 1 and 2 are indicated by a solid line or a solid square mark (■), and the measurement results of Comparative Examples 1 and 2 are indicated by a broken line or a hollow square mark (□).

With the characteristics of the light emission output illustrated in FIGS. 10 and 12, the emission output P in the example of the inventive element 1 is largely increased irrelevant to the forward current If as compared with the comparative example having no reflective electrode 13 in any of the cases where the Al molar fractions of the n-type cladding layer 6 are 55% and 20%, and therefore it is confirmed that the external quantum efficiency is improved by providing the reflective electrode 13.

However, although the external quantum efficiencies of Examples 1 and 2 are improved as compared with Comparative Examples 1 and 2 corresponding thereto, the contact area between the n-electrode 12 and the n-type cladding layer 6 is reduced in each of the examples as compared with the same in the comparative examples. Therefore, it is considered that the parasitic resistance of the n-electrode 12 becomes higher in the examples, and as a result, the forward voltage Vf of the examples becomes higher. In Example 1 and Comparative Example 1, the Al molar fraction of the n-type cladding layer 6 is 55% which is relatively high, an increase in the contact resistance between the n-electrode 12 and the n-type cladding layer 6 is found as illustrated in FIG. 1, and therefore the forward voltage Vf in Example 1 is higher than that in Comparative Example 1 as illustrated in FIG. 11. However, as described later, in regard to a conversion efficiency E (generally referred to as wall plug efficiency) which is expressed by a ratio of the emission intensity P to the power (forward voltage Vf multiplied by forward current If) fed to the light-emitting element, Example 1 is superior to Comparative Example 1. Therefore, it is found that the improvement in the external quantum efficiency is prominently present compared to the increase in the forward voltage Vf.

In contrast, in Example 2 and Comparative Example 2, since the Al molar fraction of the n-type cladding layer 6 is 20%, which is low, and the contact resistance between the n-electrode 12 and the n-type cladding layer 6 is kept low as illustrated in FIG. 1, an increase of the forward voltage Vf in Example 2 is not observed. The reason why the forward voltage Vf in Example 2 is lower than that in Comparative Example 2 in FIG. 13 is considered that the difference is within a range of measurement error.

Figure 14:
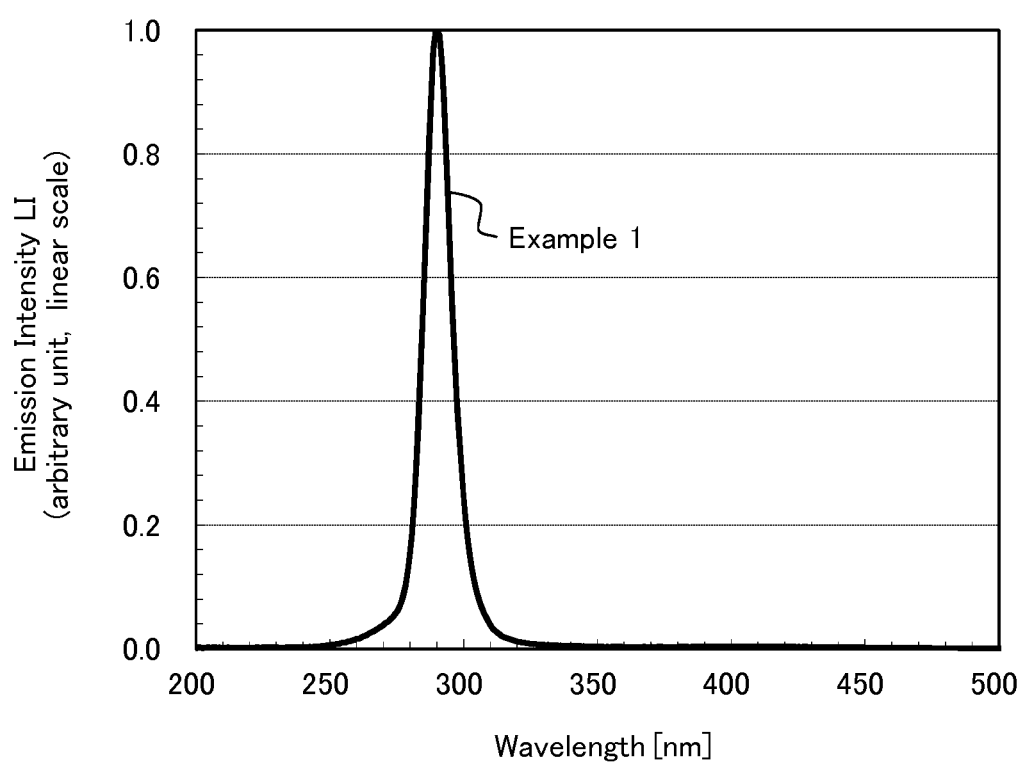
FIG. 14 is a characteristics chart indicating measurement results of wavelength dependency of emission intensity of an example in which a reflective electrode is provided on an n-type cladding layer, in the case where an Al molar fraction of the n-type cladding layer is 55%.
Figure 15:
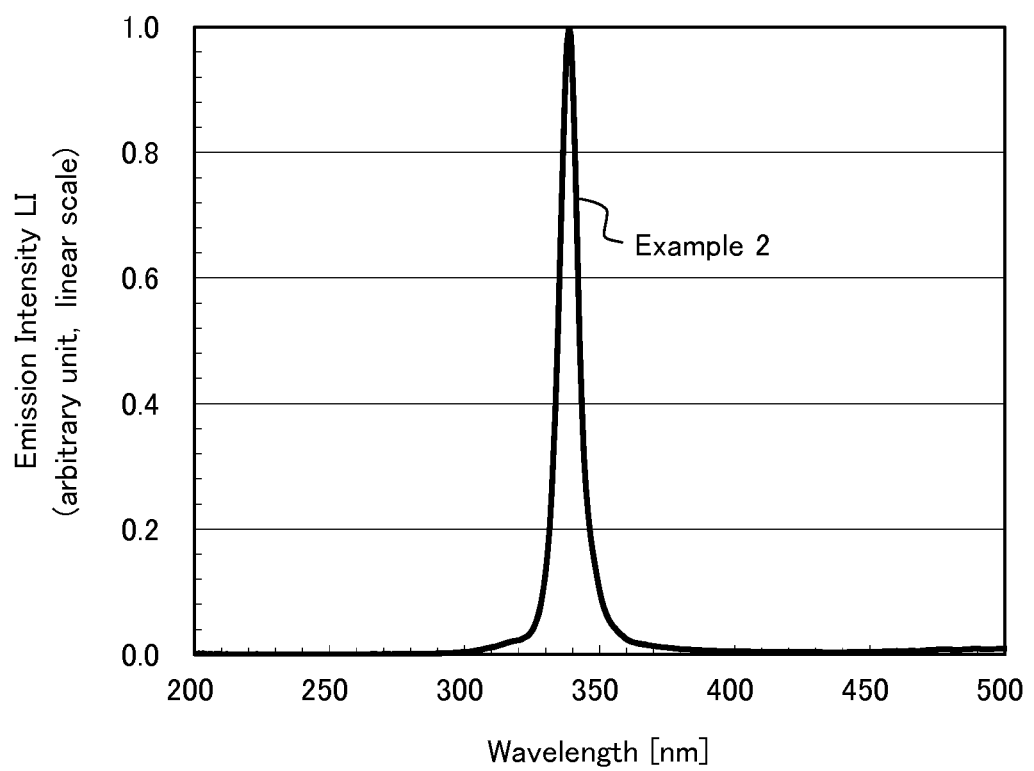
FIG. 15 is a characteristics chart indicating measurement results of wavelength dependency of emission intensity of an example in which a reflective electrode is provided on an n-type cladding layer, in the case where an Al molar fraction of the n-type cladding layer is 20%.

Further, FIGS. 14 and 15 illustrate results of measuring characteristics of wavelength dependency of emission intensity LI (arbitrary unit) in Example 1 and Example 2, respectively. The Al molar fractions of the well layer 7b of the active layer 7 in Example 1 and Example 2 are reduced to 40% and 12%, respectively, in response to a difference between the Al molar fractions of the n-type cladding layer 6, and the difference between the Al molar fractions is present as a difference between peak emission wavelengths (about 290 nm in Example 1, and 339 nm in Example 2).

Next, results of calculating the conversion efficiency E (wall plug efficiency) in Examples 1 and 2 and Comparative Examples 1 and 2 are indicated in a table in FIG. 16. The emission output P and the forward voltage Vf are measured and the conversion efficiency E is calculated on three samples in each of Examples 1 and 2 and Comparative Examples 1 and 2, and individual average values are indicated in FIG. 16. Here, a forward current If of 20 mA is used in the measurement of Example 1 and Comparative Example 1, and a forward current If of 60 mA is used in the measurement of Example 2 and Comparative Example 2.

As illustrated in FIG. 16, the average light emission output P of the three samples in Comparative Example 1 is 2.82 mW, the average forward voltage Vf is 4.97 V, and the average conversion efficiency E is 2.83%, whereas the average light emission output P of the three samples in Example 1 is 3.24 mW, the average forward voltage Vf is 5.16 V, and the average conversion efficiency E is 3.14%. In addition, the average light emission output P of the three samples in Comparative Example 2 is 2.78 mW, the average forward voltage Vf is 4.74 V, and the average conversion efficiency E is 0.98%, whereas the average light emission output P of the three samples in Example 2 is 3.24 mW, the average forward voltage Vf is 4.63 V, and the average conversion efficiency E is 1.17%. The ratio of the light emission output P of Example 1 to that of the comparative example 1 is 115% and the ratio of the light emission output P of Example 2 to that of the comparative example 2 is 117%. The ratio of the forward voltage Vf of Example 1 to that of the comparative example 1 is 104%, and the ratio of the forward voltage Vf of Example 2 to that of the comparative example 2 is 98% (substantially 100%). In both Examples 1 and 2, the increase in the light emission output P is higher than the increase in the forward voltage Vf, and therefore conversion efficiency E of Examples 1 and 2 is higher than that in Comparative Examples 1 and 2, respectively. Accordingly, it is confirmed that the external quantum efficiency is improved without sacrificing the conversion efficiency E, by providing the reflective electrode 13 in the structural portion of the n-electrode.

Second Embodiment

In the first embodiment, the description is given that the external quantum efficiency can be improved by a novel n-electrode structure formed by combining the n-electrode 12 with the reflective electrode 13, i.e., by improving the electrode structure on the n-electrode 12 side. In a second embodiment, a description will be given that the external quantum efficiency can be further improved by improving the electrode structure of two electrodes, namely, an n-electrode 12 and a p-electrode 11.

Figure 17:
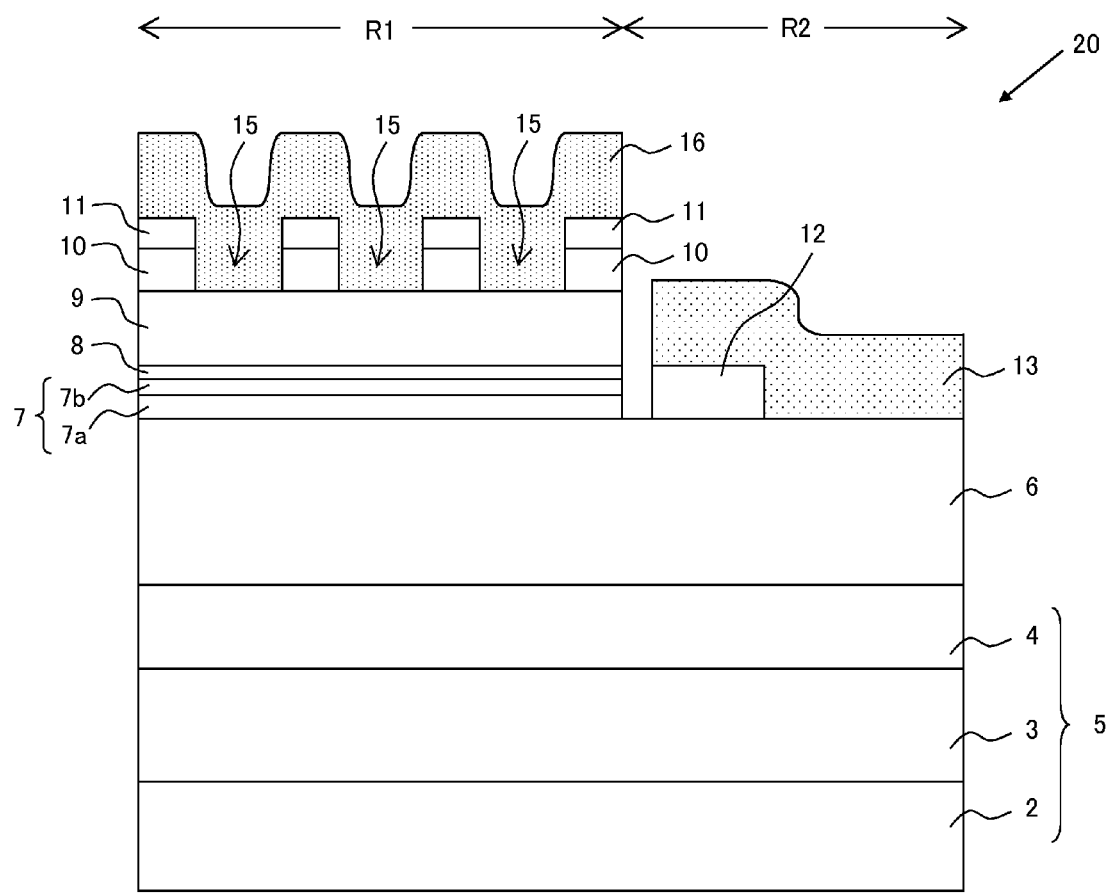
FIG. 17 is a cross sectional view schematically illustrating a laminated structure of a nitride semiconductor ultraviolet light-emitting element according to a second embodiment of the present invention.

FIG. 17 illustrates a cross sectional structure of an inventive element 20 of the second embodiment. As illustrated in FIG. 17, in the inventive element 20, an opening portion 15 penetrating to a surface of a p-type cladding layer 9 is formed on a p-type contact layer 10 by reactive ion etching or the like, the p-electrode 11 is formed on a surface of the p-type contact layer 10, and a reflective electrode 16 (corresponding to the second reflective metal layer) made of Al is formed in the opening portion 15 of the p-type contact layer 10 and on the p-electrode 11. That is, the inventive element 20 has a feature in a p-electrode structure including a base structure and a peripheral structure of the p-electrode 11. The inventive element 20 is different from the inventive element 1 of the first embodiment illustrated in FIG. 2 in respect of the p-electrode structure, but is identical with element 1 in the other respects. The reflective electrode 16 may be a three-layer metal film of Al/Ti/Au instead of a single layer of Al. Each of the p-type contact layer 10 and the p-electrode 11 is processed into a pattern such as a grid pattern (or mesh pattern), a comb-like pattern, or a dot-like pattern (island pattern), which partially covers a first region R1.

Figure 18A:
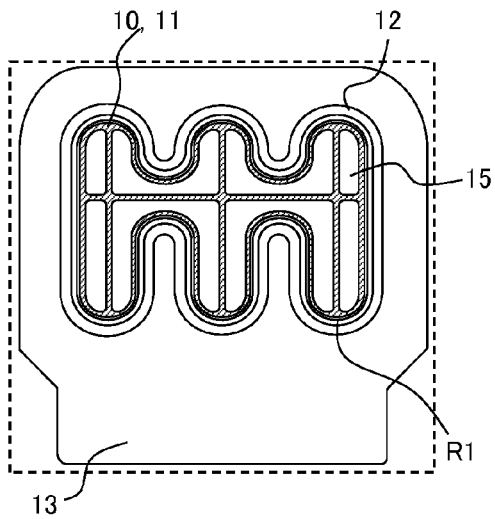
FIGS. 18A-18C are plan views schematically illustrating a planar pattern of a p-electrode of the nitride semiconductor ultraviolet light-emitting element according to the second embodiment of the present invention.
Figure 18B:
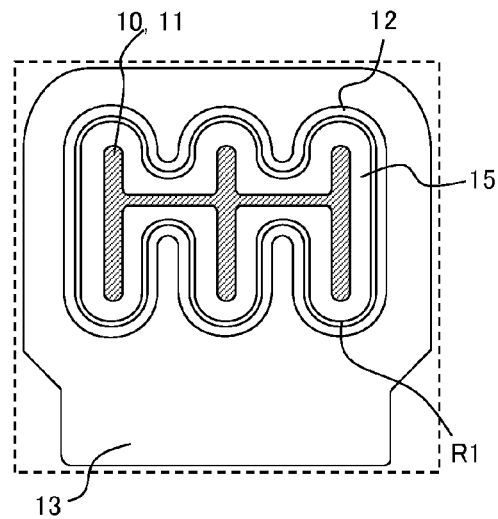
Figure 18C:
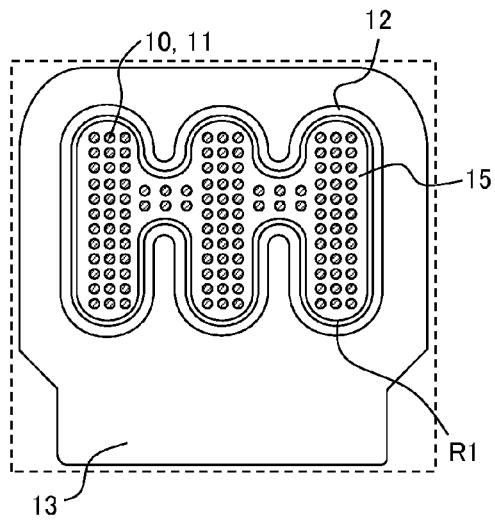

FIG. 18 illustrates one example of a planar pattern of the p-electrode 11. FIGS. 18(a) to 18(c) illustrate the cases where the p-electrode 11 is in the grid pattern, the comb-like pattern, and the dot-like pattern, respectively, in which a portion of the p-electrode 11 is distinguished by hatching.

In this embodiment, although the p-type contact layer 10 and the p-electrode 11 overlap each other with the same pattern, the p-electrode 11 may be slightly smaller than the p-type contact layer 10. Further, even if the p-electrode 11 is larger than the p-type contact layer 10 and covers a side face of a step of the p-type contact layer 10, it does not pose any problem as long as the opening portion 15 is present. A portion excluding the p-type contact layer 10 on the first region R1 is the opening portion 15. However, in the case where the p-electrode 11 is present in the opening portion 15, a portion in which the p-electrode 11 is not formed serves as the effective opening portion.

Next, a method for manufacturing the structural portion of the p-electrode will be described with reference to FIGS. 19 to 21. In the method, the steps corresponding to the steps up to forming the p-type contact layer 10 and applying the heat treatment thereto illustrated in FIG. 4, and the steps corresponding to the steps up to forming the n-electrode 12 and the reflective electrode 13 illustrated in FIGS. 5 to 8, which are described in the first embodiment, are the same, and therefore the overlapping descriptions will be omitted.

Figure 19:
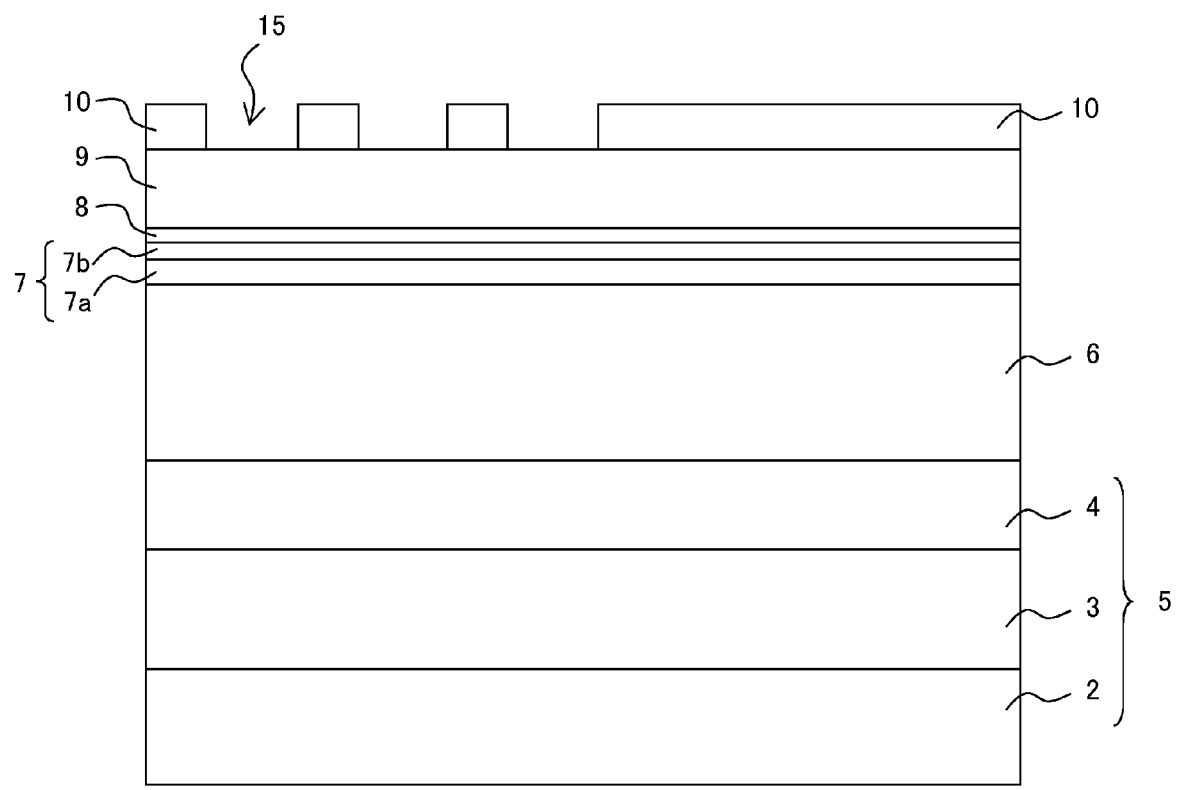
FIG. 19 is a cross sectional view schematically illustrating a laminated structure in a manufacturing step (after forming an opening portion) of the nitride semiconductor ultraviolet light-emitting element according to the second embodiment of the present invention.

After forming the p-type contact layer 10 and applying the heat treatment thereto as illustrated in FIG. 4, in a portion other than a portion in which the opening portion 15 is formed on a surface of the p-type contact layer 10 on the first region R1 is covered with, for example, an Ni mask (not illustrated) by the well-known photolithography technique, the p-type contact layer 10 in a portion which is not covered with the Ni mask is removed by the well-known anisotropic etching method such as reactive ion etching until the p-type cladding layer 9 serving as a base is exposed so as to form the opening portion 15, and thereafter the Ni mask is removed, as illustrated in FIG. 19. Then, the steps for forming the n-electrode 12 and the reflective electrode 13 illustrated in FIGS. 5 to 8 will be performed by the procedure described in the first embodiment.

Figure 20:
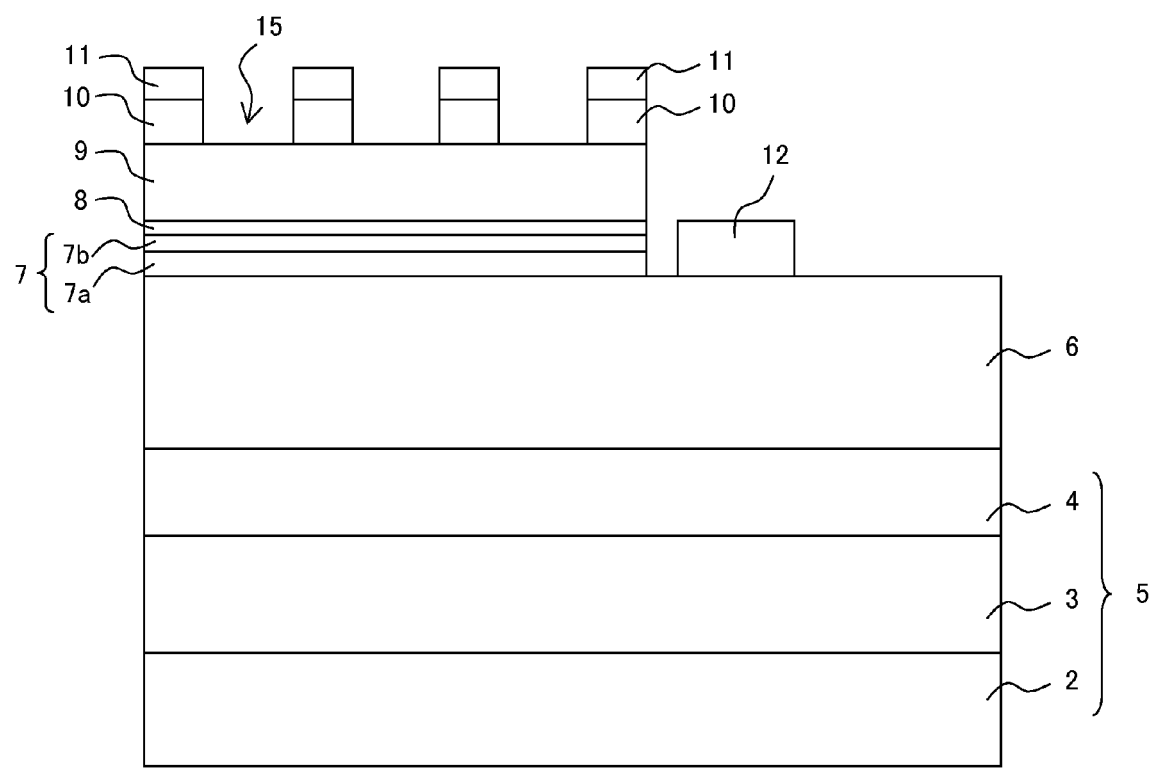
FIG. 20 is a cross sectional view schematically illustrating a laminated structure in a manufacturing step (after forming a p-electrode) of the nitride semiconductor ultraviolet light-emitting element according to the second embodiment of the present invention.

Subsequently, a photoresist (not illustrated) having a reverse pattern of that of the p-electrode 11 is formed on an entire surface of the substrate, a two-layer metal film of Ni/Au serving as the p-electrode 11 is deposited thereon by an electron-beam evaporation method or the like, the two-layer metal film on the photoresist is exfoliated by removing the photoresist by a liftoff process, and heat treatment at a temperature of 450° C. is applied by RTA or the like so as to form the p-electrode 11 on a surface of the p-type contact layer 10, as illustrated in FIG. 20. Film thicknesses of the two-layer metal film of Ni/Au are, for example, 60 nm and 50 nm, respectively, in this order.

Figure 21:
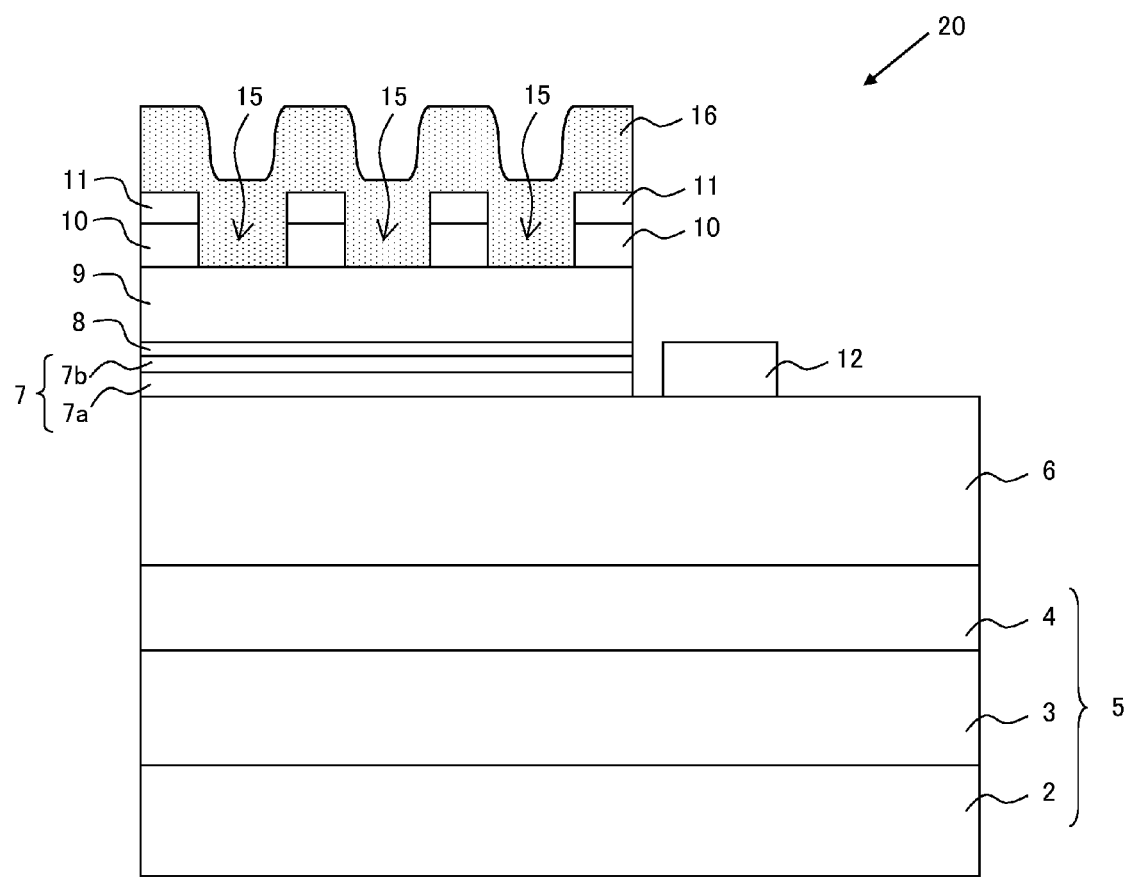
FIG. 21 is a cross sectional view schematically illustrating a laminated structure in a manufacturing step (after forming a reflective electrode in a structural portion of the p-electrode) of the nitride semiconductor ultraviolet light-emitting element according to the second embodiment of the present invention.

Subsequently, a photoresist (not illustrated) having a reverse pattern of that of the reflective metal layer 16 is formed on the entire surface of the substrate, a three-layer metal film of Al/Ti/Au serving as the reflective electrode 16 is deposited thereon by an electron-beam evaporation method or the like, the three-layer metal film on the photoresist is exfoliated by removing the photoresist by a liftoff process, and, as illustrated in FIG. 21, the reflective electrode 16 is formed substantially on an entire surface of the first region R1 in a manner to cover the p-electrode 11 and the p-type cladding layer 9 exposed in the opening portion 15. Film thicknesses of the three-layer metal film of Al/Ti/Au are, for example, 100 nm, 100 nm, and 200 nm, respectively, in this order. Here, no heat treatment is applied to the reflective electrode 16. As a result, the Al layer in the reflective electrode 16 is not melted by the heat treatment, and therefore a function of reflecting the ultraviolet ray is satisfactorily maintained. In addition, since the reflective electrode 16 makes Ohmic contact with the p-electrode 11, it can be used as an electrode pad for flip-chip bonding, wire bonding, or the like.

Next, a description will be given of the effect of making an arrangement in which, in the structural portion of the p-electrode, the opening portion 15 is formed on the first region R1 on a surface of the p-type contact layer 10, and the reflective electrode 16 is formed substantially on the entire surface of the first region R1 in a manner to cover the p-electrode 11 and the p-type cladding layer 9 exposed in the opening portion 15. Specifically, in the first embodiment, that the improvement of the external quantum efficiency is confirmed by forming the reflective electrode 13 in the structural portion of the n-electrode, whereas, in the second embodiment, the improvement of the external quantum efficiency is confirmed by forming the reflective electrode 16 in the structural portion of the p-electrode. However, in the description given below, since a sample, in which the structural portion of the n-electrode used in the first embodiment does not have the reflective electrode 13, is used as the comparative example, also a sample, in which the structural portion of the n-electrode does not have the reflective electrode 13, is used as the example of the inventive element 20 according to the second embodiment.

Figure 23A:
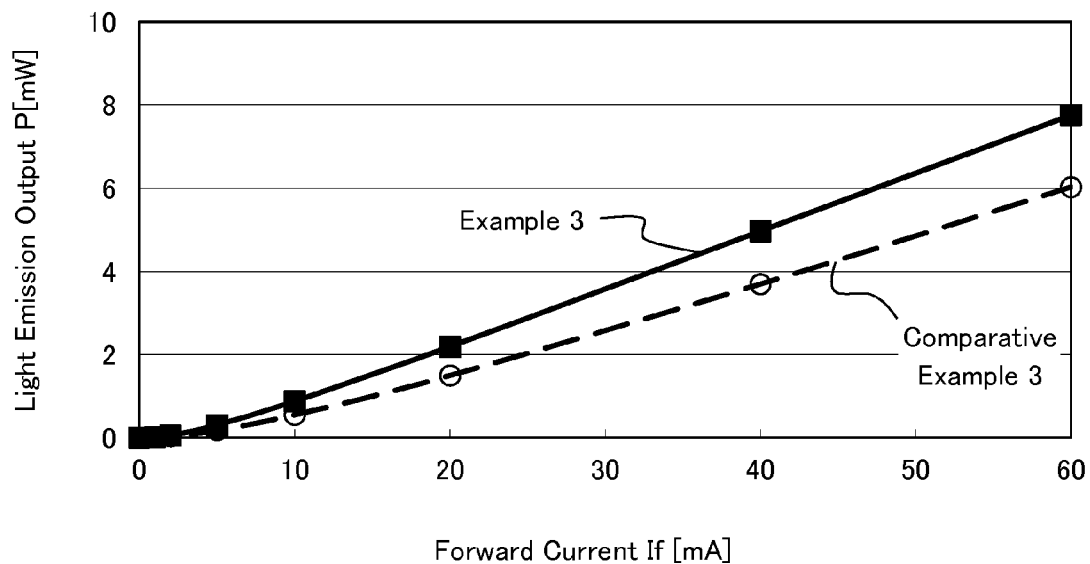
FIGS. 23A and 23B are characteristics charts indicating measurement results of characteristics of a light emission output with respect to a forward current in an example in which a reflective electrode is provided in a structural portion of a p-electrode and a comparative example in which a reflective electrode is not provided in a structural portion of a p-electrode.
Figure 23B:
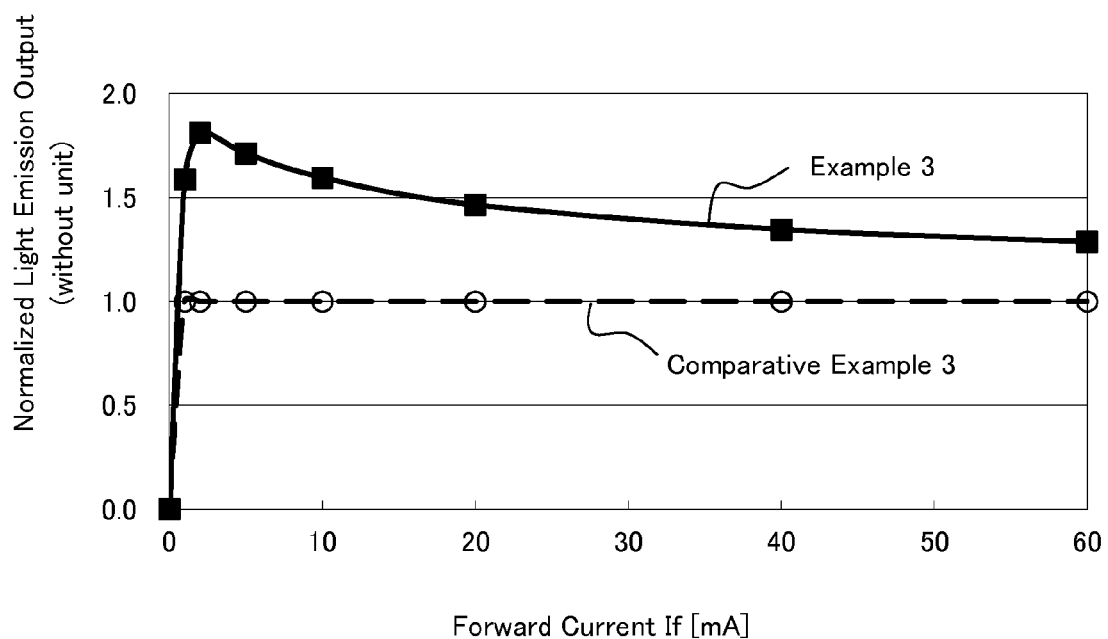
Figure 24:
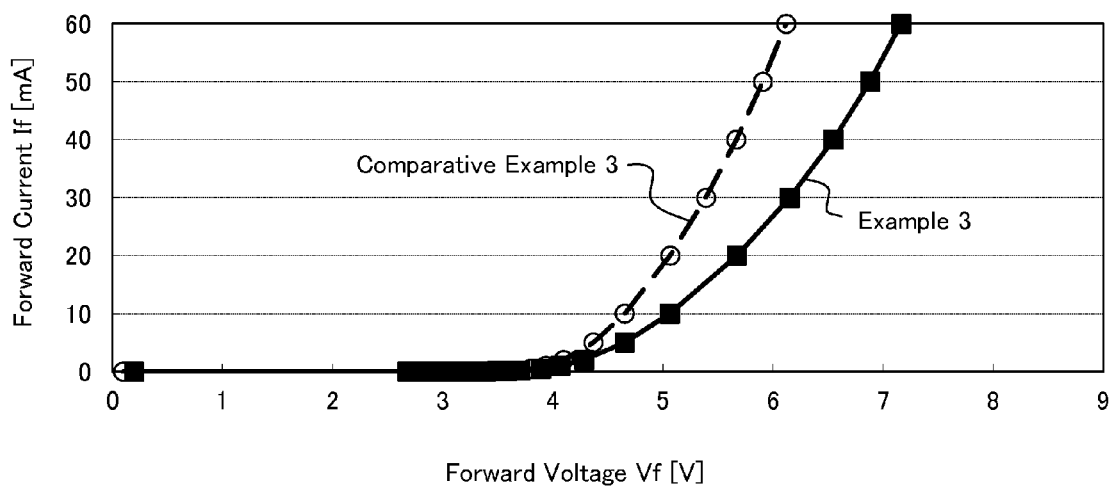
FIG. 24 is a characteristics chart indicating measurement results of current-voltage characteristics between a forward voltage and a forward current in an example in which a reflective electrode is provided in a structural portion of a p-electrode and a comparative example in which a reflective electrode is not provided in a structural portion of a p-electrode.

Next, FIGS. 22 to 24 illustrate measurement results of wavelength dependency of emission intensity LI (arbitrary unit), characteristics of a light emission output P (unit: mW) with respect to a forward current If (unit: mA), and current-voltage characteristics between a forward voltage Vf (unit: V) and the forward current If. These are measured for Example 3 of the inventive element 20 (including the reflective electrode 16 but without the reflective electrode 13), and for Comparative Example 3 in which the p-type contact layer 10 and the p-electrode 11 are formed on substantially an entire surface on the p-type cladding layer 9 but without the reflective electrode 16. Example 3 and Comparative Example 3 both use p-type GaN as the p-type contact layer 10. A ratio of 67% is used as a ratio (aperture ratio) of the area of the opening portions 15 to a total area of the p-type contact layer 10 and the opening portions 15 in Example 3. This means that the p-electrode 11 is formed in about one third of the first region R1. Further, the AlN molar fractions of the respective AlGaN layers are, for example, 60% for the n-type cladding layer 6, 50% for the barrier layer 7a, 35% for the well layer 7b, 100% for the electron block layer 8, and 40% for the p-type cladding layer 9.

Figure 22A:
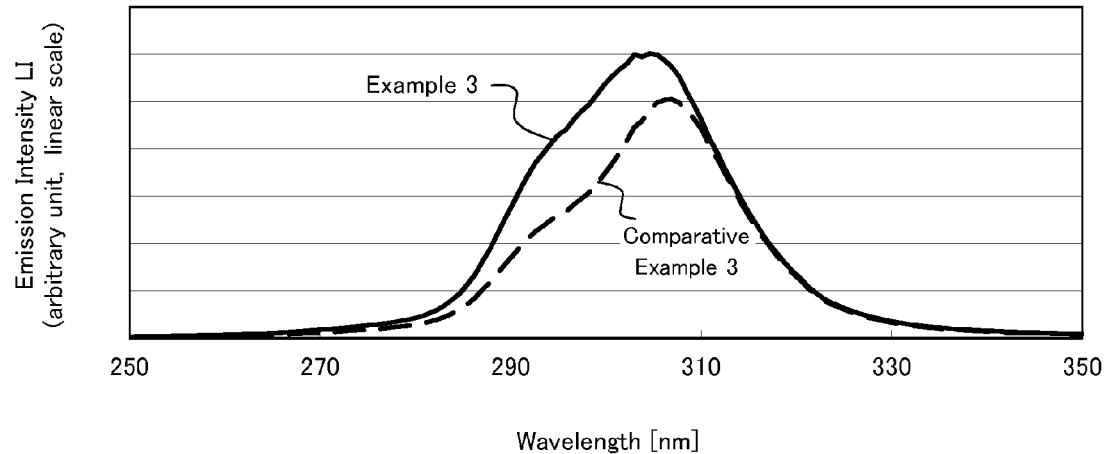
FIGS. 22A and 22B are characteristics charts indicating measurement results of wavelength dependency of emission intensity in an example in which a reflective electrode is provided in a structural portion of a p-electrode and a comparative example in which a reflective electrode is not provided in a structural portion of a p-electrode. The wavelength dependency when the emission intensity LI on the vertical axis is expressed by a linear scale is shown in FIG. 22A and by a logarithmic scale is shown in FIG. 22B.
Figure 22B:
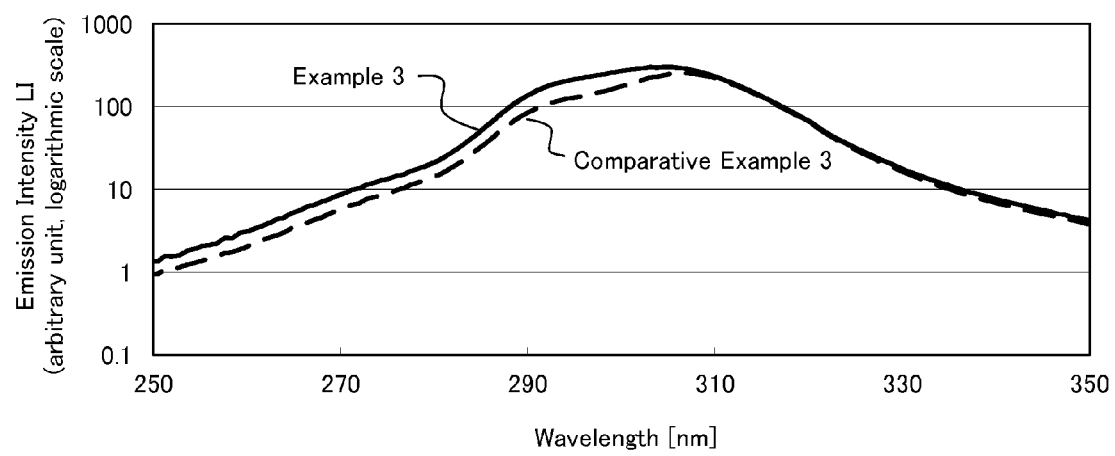

FIGS. 22(a) and 22(b) illustrate the wavelength dependency when the emission intensity LI on the vertical axis is expressed by a linear scale and a logarithmic scale, respectively. Here, the forward current If is 60 mA in both Example 3 and Comparative Example 3. FIG. 23(a) illustrate characteristics of the light emission output P with respect to the forward current If, and FIG. 23(b) illustrates characteristics resulted from normalizing the same measurement result of Example 3 by the measurement result of Comparative Example 3. FIG. 24 illustrates current-voltage characteristics between the forward voltage Vf and the forward current If. In each of the drawings, the measurement result of Example 3 is indicated by a solid line or a solid square mark (■), and the measurement result of Comparative Example 3 is indicated by a broken line and a hollow circular mark (○).

As illustrated in FIG. 22, the emission intensity LI of Example 3 is noticeably increased on a shorter wavelength side than the center emission region as compared with that of Comparative Example 3, and a peak emission wavelength is also slightly toward the shorter wavelength side. In Comparative Example 3, the peak wavelength is about 307.0 nm, and the emission intensity LI is about 252.5 (arbitrary unit). In contrast, in Example 3, the peak wavelength is about 304.6 nm, and the emission intensity LI is about 301.0 (arbitrary unit). Based on the foregoing measurement results, an improvement of the external quantum efficiency over an entire emission wavelength band is confirmed. Further, based on the results illustrated in FIG. 23, the light emission output P of Example 3 is increased more than that of the comparative example regardless of the forward current If, and therefore an improvement of the external quantum efficiency is confirmed.

However, although the external quantum efficiency of Example 3 is improved as compared with Comparative Example 3, the area of the p-type contact layer 10 becomes one third of that of the comparative example, and the Ohmic contact area is reduced. Therefore the parasitic resistance on the p-electrode 11 side is increased, and as a result, the forward voltage Vf of Example 3 is higher as illustrated in FIG. 24.

In view of this, a table in FIG. 25 indicates the results of the calculated conversion efficiency E in the case where the forward current IF is 60 mA in each case. In the measurement indicated in FIG. 25, p-type GaN is used as the p-type contact layer 10 in both Example 3 and Comparative Example 3, and 67% is used as the aperture ratio in Example 3. However, three types of patterns having the same aperture ratio are prepared as the patterns of the p-type contact layer 10 and the p-electrode 11, and are used in Examples 3A to 3C. The emission output P and the forward current Vf are measured, the conversion efficiency E is calculated for three samples each for Examples 3A to 3C and Comparative Example 3, and each of the averages is illustrated in FIG. 25. Here, the pattern for Example 3A is the grid pattern illustrated in FIG. 18(a), the pattern for Example 3B is the comb-like pattern illustrated in FIG. 18(b), and the pattern for Example 3C is the dot-like pattern illustrated in FIG. 18(c).

As illustrated in FIG. 25, the average light emission output P of the three samples for Comparative Example 3 is 5.85 mW, the average forward voltage Vf thereof is 6.23 V, and the average efficiency E thereof is 1.57%. However, the average light emission output P of the three samples for Example 3A is 7.55 mW, the average forward voltage Vf thereof is 7.41 V, and the average efficiency E thereof is 1.70%; the average light emission output P of the three samples for Example 3B is 7.61 mW, the average forward voltage Vf thereof is 7.90 V, and the average efficiency E thereof is 1.61%; and the average light emission output P of the three samples for Example 3C is 7.70 mW, the average forward voltage Vf thereof is 7.81 V, and the average efficiency E thereof is 1.64%. The ratio of the light emission output P to that of Comparative Example 3 is 129% for Example 3A, 130% for Example 3B, and 132% for Example 3C. In addition, the ratio of the forward voltage Vf to that of Comparative Example 3 is 119% for Example 3A, 127% for Example 3B, and 125% for Example 3C. In all of Examples 3A to 3C, an increase in the light emission output P is higher than the increase in the forward voltage Vf, and therefore the conversion efficiency E is higher in Examples 3A to 3C than that in Comparative Example 3. In Examples 3A to 3C, although the patterns of the p-type contact layer 10 and the p-electrode 11 are different from each other, the aperture ratios are the same. Accordingly, no large difference is found in the light emission output P and the forward voltage Vf among Examples 3A to 3C, but there is a tendency that Example 3C has a good light emission output P, and Example 3A has a good conversion efficiency E among three Examples 3A to 3C. In addition, although 67% is used as the aperture ratio in Example 3, as the aperture ratio is increased, the light emission output P naturally increases if the forward voltage Vf remains the same, and the forward voltage Vf also increases. In terms of the conversion efficiency E, an optimum aperture ratio is supposed to be present depending on the structure of the light-emitting element, the manufacturing process, the electrical specifications, and the like. However, when the external quantum efficiency is focused, it is advantageous if the aperture ratio is larger. However, when the aperture ratio is too large, a patterning process of the p-type contact layer 10 and the p-electrode 11 cannot be performed, and it is possible that the forward voltage Vf becomes too high beyond the practical range. Therefore, there is an upper limit depending on the structure of the light-emitting element, the manufacturing process, the electrical specifications, and the like.

The first embodiment described the effect of improving the external quantum efficiency by providing the reflective electrode 13 in the structural portion of the n-electrode, and the second embodiment described the effect of improving the external quantum efficiency by providing the reflective electrode 16 in the structural portion of the p-electrode. The rate of increase of the emission output P is 115% (Example 1) in the first embodiment, whereas the rate of increase of the emission output P is 129% to 132% (Examples 3A to 3C) in the second embodiment, which is the rate of increase as about twice large as that of the first embodiment. The reflective electrode 13 of the structural portion of the n-electrode is not intended for improving the external quantum efficiency by directly reflecting the light emitted from the active layer 7 as in the case of the reflective electrode 16 in the structural portion of the p-electrode, but is intended for improving the external quantum efficiency by further re-reflecting part of light emission reflected by the light exit surface. Therefore, it is expected that the effect of improving the external quantum efficiency is considerably lower than that by means of the reflective electrode 16 in the structural portion of the p-electrode. However, as described above, when the area of the contact surface between the reflective electrode 13 and the n-type cladding layer 6 is secured as large as about 180 to 200% of the area of the first region R1, about a half of the effect of improvement by means of the reflective electrode 16 in the structural portion of the p-electrode can be obtained. About 150% can be expected as a ratio of increase of the emission output P by means of two reflective electrodes 13 and 16.

Hereinafter, another embodiment will be described.

Figure 26:
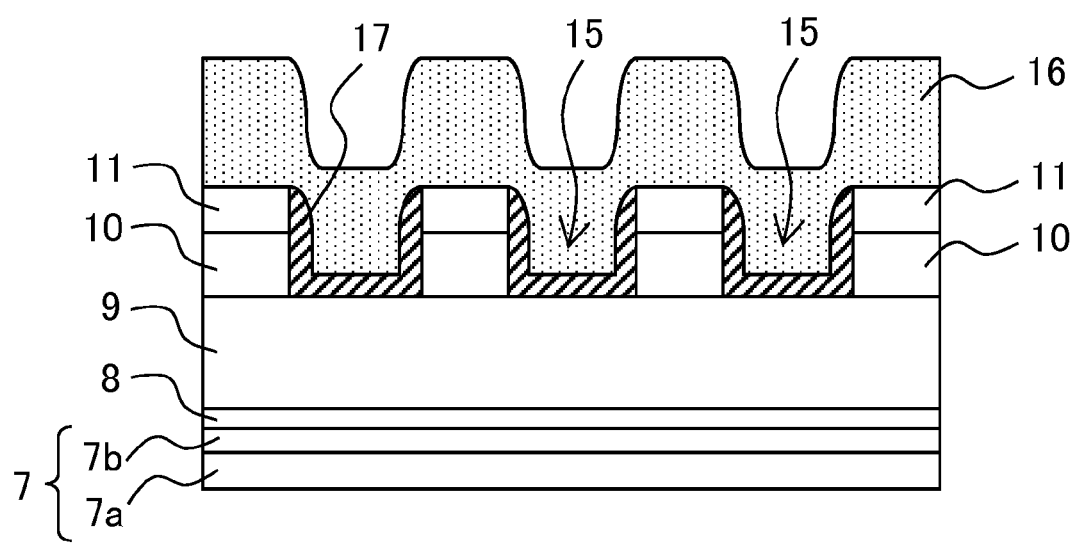
FIG. 26 is a cross sectional view schematically illustrating a principal portion of a laminated structure of a nitride semiconductor ultraviolet light-emitting element according to another implementation of the second embodiment.

(1) In the second embodiment described above, the case for forming the reflective electrode 16 directly on the surface of the p-type cladding layer 9 in the opening portion 15 is described. However, as illustrated in FIG. 26, the reflective electrode 16 may be formed after a transparent insulating film 17, such as $SiO_2$, AlN, or $HfO_2$, which allows the ultraviolet ray (particularly, the ultraviolet ray in the emission wavelength band) to pass therethrough is deposited in the opening portion 15.

(2) In the second embodiment described above, after the p-type contact layer 10 is formed on the entire surface of the p-type cladding layer 9, the opening portion 15 is formed by partially removing the p-type contact layer 10 by reactive ion etching or the like. However, in stead of this, after forming a mask for selective growth such as $SiO_2$ in a portion to be formed as the opening portion 15 on the p-type cladding layer 9, the p-type contact layer 10 of p-type GaN may be selectively grown on the p-type cladding layer 9, and a portion of the mask for selective growth may be formed as the opening portion 15. In this case, since the insulating film such as $SiO_2$ that allows the ultraviolet ray to pass therethrough is used for the mask portion, it is possible to form the reflective electrode 16 thereon without removing the mask portion.

Figure 27:
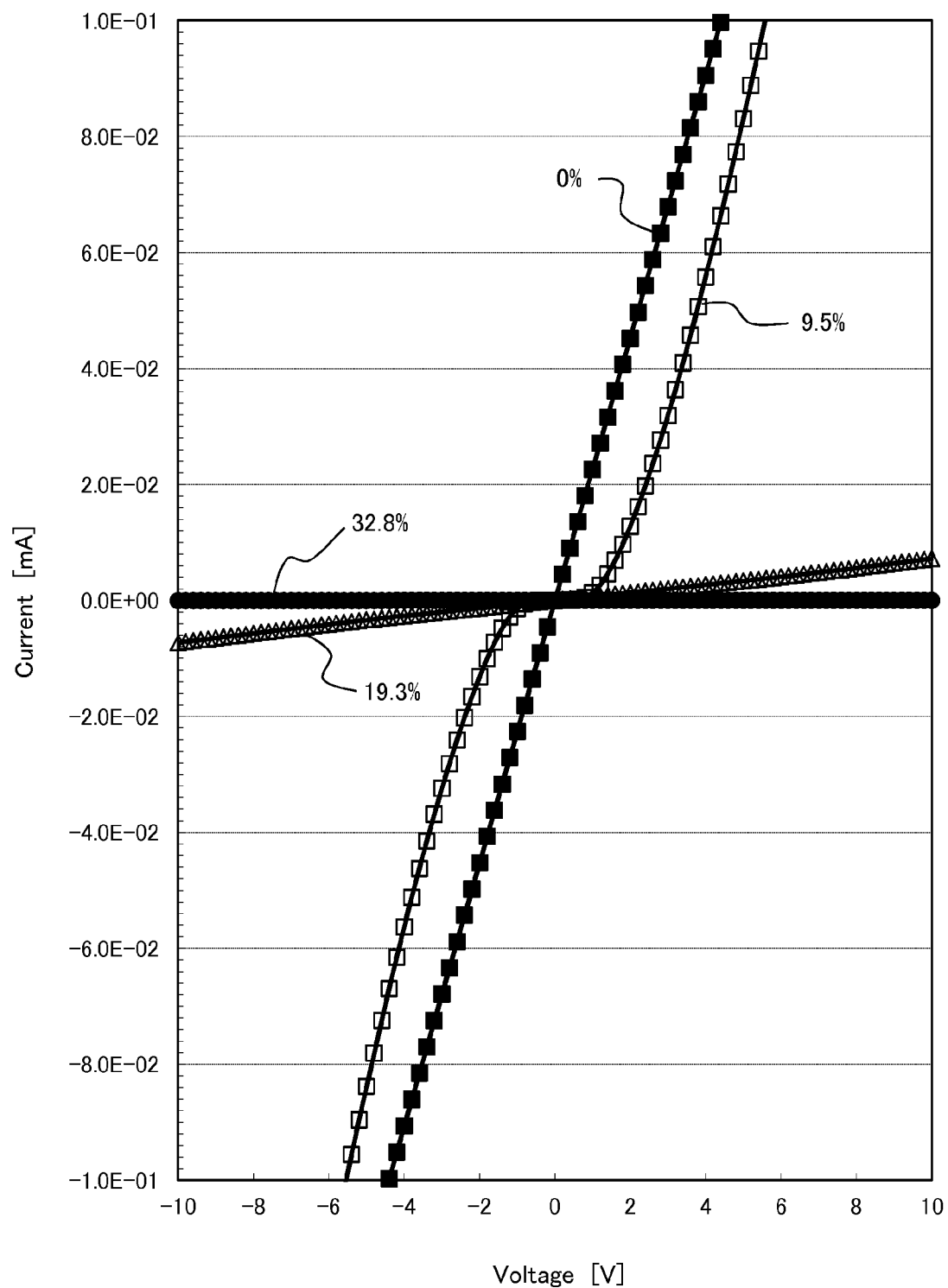
FIG. 27 is a chart indicating current-voltage characteristics of four different kinds of AlN molar fractions at an interface between a p-type contact layer and a p-electrode.

(3) In the second embodiment described above, although p-type GaN is used for the p-type contact layer 10, p-type AlGaN can be used if the AlN molar fraction thereof is smaller than 10%, and can make non-rectifying contact with the p-electrode with a low resistance. FIG. 27 illustrates AlN molar fraction dependency of current-voltage characteristics indicating contact resistance characteristics at an interface between the p-electrode and p-type AlGaN used in this embodiment. Here, the current value on the vertical axis in FIG. 27 represents a relative value. It is understood that p-type GaN having an AlN molar fraction of 0% indicates an excellent Ohmic characteristic with a low resistance. Further, p-type AlGaN having an AlN molar fraction of 9.5% indicates a varistor-like non-linear current-voltage characteristic. However, it is understood that, with application of a voltage of 1 V or higher, it indicates a low resistance and non-rectifying resistance characteristic. In contrast, p-type AlGaN having an AlN molar fraction of 19.3% has a resistance which is 30 times or more as large as that of p-type GaN, which is not practical. In addition, p-type AlGaN having an AlN molar fraction of 32.8% has a resistance which is higher by about four digits as compared with that of p-type GaN, which cannot be used.

(4) In the second embodiment described above, it is not necessary that the reflective electrode 13 in the structural portion of the n-electrode and the reflective electrode 16 in the structural portion of the p-electrode have the same composition and the same structure. For example, one of them may be an Al single layer film, and the other may be a three-layer film of Al/Ti/Au. Further, in the second embodiment described above, the description was given of the case where the reflective electrode 13 is formed after forming the n-electrode 12, and the reflective electrode 16 is formed after forming the p-electrode 11. However, two of the reflective electrodes 13 and 16 may be formed after forming the n-electrode 12 and the p-electrode 11. Further, order of forming two of the reflective electrodes 13 and 16 is not particularly a matter, and the two may be formed simultaneously.

(5) In each of the embodiments described above, the template 5 illustrated in FIGS. 2 and 17 is used as an example that constitutes the inventive elements 1 and 20. However, this is not limited to the template 5, and, for example, an ELO-AlN layer illustrated in FIG. 28 may be used as the AlN layer 3, the AlGaN layer 4 may be omitted, or another substrate may be used instead of the sapphire (0001) substrate 2. Further, the film thickness and the AlN molar fraction of each film of AlGaN or GaN that constitutes the inventive elements 1 and 20 exemplified in each of the embodiments described above are one example, and can be arbitrarily changed depending on the specifications of the element. Furthermore, in each of the embodiments described above, a case where an electron block layer 8 is provided is indicated as an example, the electron block layer 8 may not necessarily be provided.

(6) In each of the embodiments described above, cases where the p-electrode 11 is made of Ni/Au, the n-electrode 12 is made of Ti/Al/Ti/Au, the reflective electrodes 13 and 16 are made of Al or Al/Ti/Au are described as examples, the material and the film thickness of each of the electrodes is not limited to the foregoing. An electrode material for the p-electrode 11 and the n-electrode 12 may be a metal material that can make Ohmic contact (or non-rectifying contact with a low resistance) with the p-type contact layer 10 and the n-type cladding layer 6 which are the base layers thereof, respectively, may have a structure which is not a multilayer structure as described above, and further may have a structure in which the layer structure thereof is alloyed by heat treatment. The example for using Ti for the n-electrode 12 as a metallic material (adhesive layer) for increasing adherence with the n-type cladding layer 6 is described. However, Cr may be used instead of Ti, or such an adhesive layer may not necessarily be provided. The reflective metal layers 13 and 16 need to include a metal that reflects the ultraviolet ray, for example, a metal containing Al as a main component, but may not necessarily make Ohmic contact with the base layer.

(7) In the second embodiment described above, when the reflective electrode 16 is formed, the reflective electrode 16 is formed on a substantially entire surface of the first region in a manner to cover the p-electrode 11. However, it is also a preferable embodiment to form the reflective electrode 16 on a side wall surface of the laminated body in a range from the active layer 7 to the p-type contact layer 10 that are formed on the first region. In such a case, it is necessary to form a side wall insulating film using $SiO_2$ or the like between the side wall surface of the laminated body and the reflective electrode 13 to prevent each layer of the laminated body from electrically establishing a short circuit. The side wall insulating film is formed by depositing an insulating film using $SiO_2$ or the like on an entire surface of the substrate after forming the p-electrode 11, and removing the insulating film thus deposited by anisotropic etching, so that the insulating film remaining in a form of a side wall on the side wall surface of the laminated body is formed as the side wall insulating film. After the side wall insulating film is formed, a photoresist having a reverse pattern of the reflective electrode 16 is formed on an entire surface of the substrate without covering the side wall insulating film, and the reflective electrode 16 covering the side wall surface of the laminated body is formed by depositing of a material film of the reflective electrode 16, and a liftoff process of the photoresist. Further, it is also a preferable embodiment to form the reflective electrode 13 instead of the reflective electrode 16 on the side wall surface of the laminated body in a range from the active layer 7 to the p-type contact layer 10 that are formed on the first region, in the same manner as described above.

INDUSTRIAL APPLICABILITY

The nitride semiconductor ultraviolet light-emitting element according to the present invention can be used for a light-emitting diode and the like having a center emission wavelength of 355 nm or smaller, and is effective for improving the external quantum efficiency.

EXPLANATION OF REFERENCES

1, 20: Nitride semiconductor ultraviolet light-emitting element
2,101: Sapphire substrate
3: AlN layer
4: AlGaN layer
5: Template
6,104: n-type cladding layer (n-type AlGaN)
7: Active layer
7a: Barrier layer
7b: Well layer
8,106: Electron block layer (p-type AlGaN)
9,107: p-type cladding layer (p-type AlGaN)
10,108: p-type contact layer (p-type GaN)
11,109: p-electrode
12,110: n-electrode
13: Reflective electrode (first reflective metal layer)
14: Ni mask
15: Opening portion
16: Reflective electrode (second reflective metal layer)
17: Transparent insulating film
102: Base layer (AlN)
103: ELO-AlN layer
105: Multi-quantum well active layer
R1: First region
R2: Second region

The invention claimed is:

1. A nitride semiconductor ultraviolet light-emitting element comprising:
an n-type cladding layer configured of an n-type AlGaN semiconductor layer;
the n-type cladding layer formed on a template allowing the ultraviolet light to pass therethrough and configured of an insulator layer, a semiconductor layer, or a laminated body configured of the insulator layer and the semiconductor layer, the template including an AlN layer;
an active layer including an AlGaN semiconductor layer having a band gap energy of 3.4 eV or higher;
a p-type cladding layer configured of a p-type AlGaN semiconductor layer and located above the active layer;
an n-electrode metal layer making Ohmic contact with the n-type cladding layer; and
a first reflective metal layer reflecting ultraviolet light emitted from the active layer,
wherein
the active layer and the p-type cladding layer are formed in a first region on the n-type cladding layer, the first region being in a plane parallel to a surface of the n-type cladding layer,
the n-electrode metal layer is formed on an adjacent region to the first region, the adjacent region being in a second region which is a region other than the first region on the n-type cladding layer,
the first reflective metal layer is formed on a surface of the n-type cladding layer in the second region other than the adjacent region, and
the n-electrode metal layer is arranged between the first region and a region in which the first reflective metal layer contacts the surface of the n-type cladding layer.

2. The nitride semiconductor ultraviolet light-emitting element according to claim 1, wherein
the first reflective metal layer covers at least part of an upper surface of the n-electrode metal layer, and makes electric contact with the n-electrode metal layer.

3. The nitride semiconductor ultraviolet light-emitting element according to claim 1, wherein
an AlN molar fraction of the n-type cladding layer is larger than an AlN molar fraction of the active layer, and is 60% or smaller.

4. The nitride semiconductor ultraviolet light-emitting element according to claim 1, wherein
the first reflective metal layer is configured of Al, or a metal multilayer film or an alloy including Al as a main component.

5. The nitride semiconductor ultraviolet light-emitting element according claim 1, wherein
a p-type contact layer configured of a p-type AlGaN semiconductor layer that absorbs the ultraviolet light is formed on the p-type cladding layer,
the p-type contact layer includes an opening portion that penetrates to a surface of the p-type cladding layer,
a p-electrode metal layer that makes Ohmic contact or non-rectifying contact with the p-type contact layer is formed on the p-type contact layer so as not to completely cover the opening portion,
a second reflective metal layer that reflects the ultraviolet light is formed at least on the opening portion, and
the second reflective metal layer covers the surface of the p-type cladding layer exposed through the opening portion either directly or through a transparent insulating layer that allows the ultraviolet light to pass therethrough.

6. The nitride semiconductor ultraviolet light-emitting element according to claim 5, wherein
an AlN molar fraction of the p-type contact layer is 0% or larger and smaller than 10%.

7. The nitride semiconductor ultraviolet light-emitting element according to claim 5,
wherein the second reflective metal layer is formed at least on the opening portion and the p-electrode metal layer.

8. The nitride semiconductor ultraviolet light-emitting element according to claim 5, wherein
the second reflective metal layer is configured of Al, or a metal multilayer film or an alloy including Al as a main component.

9. The nitride semiconductor ultraviolet light-emitting element according to claim 5, wherein
a ratio of an area of the opening portion to a total area of the p-type contact layer and the opening portion is 66% or more.

10. A nitride semiconductor ultraviolet light-emitting element comprising:
an n-type cladding layer configured of an n-type AlGaN semiconductor layer;
an active layer including an AlGaN semiconductor layer having a band gap energy of 3.4 eV or higher;
a p-type cladding layer configured of a p-type AlGaN semiconductor layer and located above the active layer;
an n-electrode metal layer making Ohmic contact with the n-type cladding layer; and
a first reflective metal layer reflecting ultraviolet light emitted from the active layer,
wherein
the active layer and the p-type cladding layer are formed in a first region on the n-type cladding layer, the first region being in a plane parallel to a surface of the n-type cladding layer,
the n-electrode metal layer is formed on an adjacent region to the first region, the adjacent region being in a second region which is a region other than the first region on the n-type cladding layer,
the first reflective metal layer is formed on a surface of the n-type cladding layer in the second region other than the adjacent region,
the n-electrode metal layer is arranged between the first region and a region in which the first reflective metal layer contacts the surface of the n-type cladding layer;
a p-type contact layer configured of a p-type AlGaN semiconductor layer that absorbs the ultraviolet light is formed on the p-type cladding layer,
the p-type contact layer includes an opening portion that penetrates to a surface of the p-type cladding layer,
a p-electrode metal layer that makes Ohmic contact or non-rectifying contact with the p-type contact layer is formed on the p-type contact layer so as not to completely cover the opening portion,
a second reflective metal layer that reflects the ultraviolet light is formed at least on the opening portion, and
the second reflective metal layer covers the surface of the p-type cladding layer exposed through the opening portion either directly or through a transparent insulating layer that allows the ultraviolet light to pass therethrough.

11. The nitride semiconductor ultraviolet light-emitting element according to claim 10, wherein
an AlN molar fraction of the p-type contact layer is 0% or larger and smaller than 10%.

12. The nitride semiconductor ultraviolet light-emitting element according to claim 10, wherein
the second reflective metal layer is formed at least on the opening portion and the p-electrode metal layer.

13. The nitride semiconductor ultraviolet light-emitting element according to claim 10, wherein
the second reflective metal layer is configured of Al, or a metal multilayer film or an alloy including Al as a main component.

14. The nitride semiconductor ultraviolet light-emitting element according to claim 10, wherein
a ratio of an area of the opening portion to a total area of the p-type contact layer and the opening portion is 66% or more.

15. The nitride semiconductor ultraviolet light-emitting element according to claim 10, wherein
the first reflective metal layer covers at least part of an upper surface of the n-electrode metal layer, and makes electric contact with the n-electrode metal layer.

16. The nitride semiconductor ultraviolet light-emitting element according to claim 10, wherein
an AlN molar fraction of the n-type cladding layer is larger than an AlN molar fraction of the active layer, and is 60% or smaller.

17. The nitride semiconductor ultraviolet light-emitting element according to claim 10, wherein
the first reflective metal layer is configured of Al, or a metal multilayer film or an alloy including Al as a main component.

* * * * *